(12) United States Patent
Pöppe et al.

(10) Patent No.: US 11,385,285 B2
(45) Date of Patent: Jul. 12, 2022

(54) AUTOMATED TEST EQUIPMENT USING AN ON-CHIP-SYSTEM TEST CONTROLLER

(71) Applicant: Advantest Corporation, Tokyo (JP)

(72) Inventors: Olaf Pöppe, Tübingen (DE); Klaus-Dieter Hilliges, Stuttgart (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/070,696

(22) Filed: Oct. 14, 2020

(65) Prior Publication Data
US 2021/0025938 A1 Jan. 28, 2021

Related U.S. Application Data

(63) Continuation of application No. PCT/EP2020/051538, filed on Jan. 22, 2020.

(60) Provisional application No. 62/795,456, filed on Jan. 22, 2019.

(51) Int. Cl.
| | |
|---|---|
| *G01R 31/3183* | (2006.01) |
| *G01R 31/319* | (2006.01) |
| *G01R 31/317* | (2006.01) |
| *G01R 31/3177* | (2006.01) |
| *G06F 13/20* | (2006.01) |
| *G06F 11/273* | (2006.01) |

(52) U.S. Cl.
CPC . *G01R 31/318307* (2013.01); *G01R 31/3177* (2013.01); *G01R 31/31712* (2013.01); *G01R 31/31713* (2013.01); *G01R 31/31724* (2013.01); *G01R 31/31905* (2013.01); *G01R 31/31907* (2013.01); *G01R 31/31908* (2013.01); *G01R 31/31926* (2013.01); *G06F 11/2733* (2013.01); *G06F 13/20* (2013.01)

(58) Field of Classification Search
None
See application file for complete search history.

(56) References Cited

U.S. PATENT DOCUMENTS

| | | |
|---|---|---|
| 5,103,450 A | 4/1992 | Whetsel |
| 5,321,702 A | 6/1994 | Brown et al. |
| 6,460,152 B1 | 10/2002 | Demidov et al. |
| 7,562,271 B2 | 7/2009 | Shaeffer et al. |
| 10,161,993 B2 | 12/2018 | Frediani et al. |
| 2003/0009715 A1 | 1/2003 | Ricchetti et al. |
| 2005/0060600 A1 | 3/2005 | Jeddeloh |
| 2006/0156113 A1 | 7/2006 | Whetsel |
| 2008/0114562 A1 | 5/2008 | Sul et al. |
| 2008/0114563 A1 | 5/2008 | Kappauf et al. |
| 2010/0003837 A1 | 1/2010 | Loughner et al. |
| 2010/0023294 A1 | 1/2010 | Fan et al. |
| 2011/0004793 A1* | 1/2011 | Sul .............. G11C 29/02 714/718 |
| 2011/0273197 A1 | 11/2011 | Banerjee et al. |
| 2014/0114603 A1 | 4/2014 | Moon et al. |

(Continued)

*Primary Examiner* — Guerrier Merant

(57) ABSTRACT

An automated test equipment for testing a device under test comprises an on-chip-system-test controller. The on-chip system test controller comprises at least one debug interface or control interface configured to communicate with the device under test. The on-chip-system-test controller optionally comprises at least one high bandwidth interface configured to communicate with the device under test. The on-chip-system-test controller is configured to control a test of a device-under-test which is a system-on-a chip.

29 Claims, 16 Drawing Sheets

(56) References Cited

U.S. PATENT DOCUMENTS

| | | |
|---|---|---|
| 2014/0236525 A1 | 8/2014 | Chan et al. |
| 2014/0237292 A1 | 8/2014 | Chan |
| 2014/0244204 A1* | 8/2014 | Frediani ........... G01R 31/31907 702/119 |
| 2015/0028908 A1* | 1/2015 | Kushnick ............ G06F 11/2221 324/750.05 |
| 2018/0196103 A1 | 7/2018 | Champoux et al. |
| 2018/0275198 A1 | 9/2018 | Maekawa |
| 2018/0293786 A1 | 10/2018 | Insko et al. |

\* cited by examiner

AUTOMATED TEST EQUIPMENT USING AN ON-CHIP-SYSTEM TEST CONTROLLER

CROSS-REFERENCE TO RELATED APPLICATIONS

This application is a continuation of co-pending International Application No. PCT/EP2020/051538, filed Jan. 22, 2020, which is incorporated herein by reference in its entirety, which claims priority to U.S. Provisional Application 62/795,456 entitled "Testing Concepts, For Example For Onchip-System Test (OCST)," filed Jan. 22, 2019, and hereby incorporated by reference in its entirety.

TECHNICAL FIELD

Embodiments according to the present invention create an automated test equipment.

Generally speaking, embodiments according to the invention create an effective test environment for on-chip system tests.

Further embodiments according to the invention create an on-chip system test.

BACKGROUND OF THE INVENTION

In the following, some technical fields will be described in which embodiments according to the present invention can be used.

In the recent years, there has been an increasing demand for testing of systems-on-a-chip (SOCs), systems-in-a-package (SITs) or modules with at least one integrated processor.

It should be noted that the following disclosure lists only "SOC" or "DUT" but is applicable to higher levels of integration in a package or on any kind of module implementing a (sub-) system.

In the following, some system-on-a-chip (SoC or SOC) trends will be described. Recently, there is the trend that central processing unit cores (CPU cores) are everywhere. For example, it should be noted that approximately 17 billion units with ARM CPU cores have been shipped last year. Also, there is a trend that pure hardware design changes to hardware/software co-design.

Moreover, there is a trend that IP resource is widely spread. This enables, for example, extremely high integration on new process nodes. Moreover, for example, common on-chip interconnect architectures are established to support this trend. As an example, a widely used standard for these interconnections is AMBA for ARM.

Moreover, there's a trend that mobile applications drive advanced power management technologies. For example, it is desirable to run cores at optimal clock rates and supply voltages. Moreover, it is desirable to dynamically change clock ranges and supply voltages. Furthermore, it is desirable to dynamically switch off idle cores.

Furthermore, there is also a trend to have an increased number of multi-chip module offerings. For example, a reduced pin count on the module interface simplifies a printed circuit board design (PCB design). Moreover, as an example, 2% D and 3D packaging technologies enable smaller form factors for mobile applications.

In the following, an anatomy of a typical SoC will be described briefly. It should be noted that such a system on a chip may, for example, be tested using the concepts disclosed herein.

FIG. 4 shows a block schematic diagram of a system on a chip. The system is designated in its entirety with 400. The system comprises, for example, a central processing unit core (CPU core) 410, a static random access memory (SRAM) 404, an L2 cache 408, a non-volatile random access memory (NVRAM) 412 and a read-only memory 416. For example, the CPU core 410, the SRAM, the L2 cache, the NVRAM and ROM may all be coupled to an asynchronous application interconnect 420.

Moreover, the system may comprise a debug/design for test (DFT) access block 430, a peripheral block 440 and a coprocessor 450. For example, the peripheral block 440 and the coprocessor 450 may also be coupled by the asynchronous application interconnect 420.

Furthermore, it should be noted that the debug/DFT access block 430 may also be coupled to the asynchronous application interconnect 420 to transfer data to any of the blocks connected to the asynchronous application interconnect.

Moreover, the CPU core 410 and debug/DFT access block 430 may also be coupled to an asynchronous debug interconnect 460. The peripheral block 440 and the coprocessor 450 may optionally also be coupled to the asynchronous debug interconnect 460.

A debug/DFT access block 430 may, for example, be coupled to a dedicated input/output (I/O) for debug access. The dedicated input/output for debug access may, for example, be a JTAG interface or a serial-wire debug (SWD) interface.

Moreover, the system 400 optionally comprises an input/output multiplexer 470, which may be configured to determine which input/output lines of the SoC 400 are connected to which pins of a package of the SoC 400. For example, the system 400 may comprise shared input/output for low speed digital, scan (e.g., scan chains for reading and/or setting a register) and trace output. However, it should be noted that there may be dedicated input/output for debug access, and that there may also be dedicated input/output for analog signals, radio frequency (RF) signals, and/or high speed digital signals provided by the one or more peripheral blocks 440 and/or received by the one or more peripheral blocks 440.

Moreover, it should be noted that the I/O multiplexer 470 may, for example, be coupled with the debug/DFT access block 430, wherein the debug/DFT access block 430 may, for example, control the functionality of the I/O multiplexer. However, a routing of one or more signals from or to the debug/DFT access block 430 may also be determined by the I/O multiplexer 470.

Moreover, it should be noted that there may be a scan access to signals (for example, to register contents) within one or more of the blocks of the SoC, for example, to signals within the CPU core 410, to signals within the one or more peripheral blocks 440 and to signals within the one or more coprocessors 450. The scan access may, for example, allow for setting signals (for example, register contents) in said blocks and/or for reading out signals (e.g., register contents) from said blocks. The scan access may, for example, be controlled by the debug/DFT access block 430 or may, alternatively, be controlled by one or more other signals.

However, it should be noted that the SoC 400 should be considered as an example only.

FIG. 5 shows an anatomy of a typical module. In other words, FIG. 5 shows a block schematic diagram of a module 500, which can be tested in accordance with the concepts discussed herein or by the automated test equipment disclosed herein.

The module 500 may, for example, be similar to the SoC 400 described with respect to FIG. 4, such that equal or corresponding blocks will not be described here again. Rather, reference is made to the above explanations.

The module 500 comprises, for example, a CPU core 510, an SRAM 504, a L2 cache 508, a non-volatile random access memory 512, a read-only memory 516, an asynchronous application interconnect 520, a debug/DFT access block 530, one or more peripheral blocks 540, one or more coprocessors 550 and an asynchronous debug interconnect 560. Blocks 510, 504, 508, 512, 516, 520, 530, 540, 550, 560 may correspond to blocks 410, 404, 408, 412, 416, 420, 430, 440, 450, 460.

However, it should be noted that the module 512, may, in some cases, not comprise an input/output multiplexer.

On the other hand, the module 500 optionally comprises one or more host interfaces 580, one or more memory controllers 584 and one or more flash controllers 588. For example, the one or more host interfaces 580 may be coupled with the asynchronous application interconnect 520 and may, for example, provide external high bandwidth interfaces of the module (like, for example, a PCIe interface, a USB interface or a SDIO interface). The one or more memory controllers may, for example, be coupled with the asynchronous application interconnect 520 and may also be coupled with a dynamic random access memory (DRAM). Accordingly, the one or more memory controllers 584 may provide a comparatively large memory for usage by the CPU core.

Moreover, the one or more flash controllers 588 may be coupled with the asynchronous application interconnect 520 and may also be coupled with a flash memory (e.g., NAND flash). Accordingly, the CPU core 510 may be able to access a flash memory via the one or more flash controllers 588.

Moreover, it should be noted that the one or more host interfaces 580, the one or more memory controllers 584 and the one or more flash controllers 588 may optionally also be coupled to the asynchronous debug interconnect 560, which may, for example, allow for a setting or debugging of internal signals (or internal states) of said blocks 580, 584, 588, which may be controlled by the debug/DFT access block 530.

However, it has been found that SOC test and validation raises a number of challenges.

For example, it has been found that asynchronous communication defects are not sufficiently covered by an AC scan. Rather, it has been found that asynchronous communication channels should be (or in some cases, even must be) tested functionally.

Moreover, it has also been found that dynamic power management defects are also not sufficiently covered by AC scan. It has been concluded that on-chip power management should be (or in some cases, must be) tested functionally (potentially supported by a parametric DFT).

Moreover, it has been found that, due to the complexity and asynchronous structures, device responses can be only evaluated with the help of behavior models. It has also been found and concluded that traditional ATE functional pattern do not work anymore.

Moreover, it has been found that, as a result, there is an increasing coverage gap. It has been concluded that ATE tests are augmented with system level tests utilizing the application environment and software.

Furthermore, it has been found that with the application environment and software, not all corner cases are covered. It has been concluded that there is still a coverage gap after system level test (SLT).

It has also been found that software bugs might be activated by design marginalities. It has been concluded that running a few samples through post silicon validation is not sufficient to find all relevant hardware and software issues.

To conclude, it has been found that there is a need for improved concepts for testing systems on a chip.

SUMMARY OF THE INVENTION

An embodiment according to the invention creates an automated test equipment for testing a device under test (e.g. a system-on-a-chip), wherein the automated test equipment comprises an on-chip-system-test controller.

The on-chip system test controller comprises at least one debug interface or control interface (e.g. JTAG, SWD, SPI, I2C, UART) configured to communicate with the device under test. The on-chip-system-test controller preferably, but not necessarily, comprises at least one high bandwidth interface (e.g. USB or PCI) configured to communicate with the device under test, and the on-chip-system-test controller is configured to control a test (e.g. an upload of a program, and/or an execution of one or more portions of a test program, and/or an obtention of result data, and/or a debugging) of a device-under-test which is a system-on-a chip (e.g. a rather simple device under test having a single embedded processor, or a complex many-core device). It should be noted that embodiments according to the invention can be used for a testing of many different types of devices under test, as long as they have an embedded processor, which includes both rather simple devices having an embedded processor (i.e. simple SoCs) and many-core devices (i.e. complex SoCs).

This automated test equipment is based on the finding that a system on a chip or a module can be tested with a good compromise between test effort, test coverage and test speed using an automated test equipment which comprises a dedicated on-chip-system-test controller which is adapted to communicate with the device under test both via a debug interface or control interface and optionally via a high bandwidth interface (wherein it should be noted that many aspects of the invention can be implemented and will work without a HSIO, wherein all control is through debug interfaces and/or control interfaces).

By having such a dedicated on-chip-system-test controller, it is, for example, possible to exploit both the capabilities of the debug interface or control interface of the device under test and the speed advantages of the high bandwidth interface while avoiding any bottlenecks which may occur in conventional tester configurations.

For example, using the debug interface or control interface, it is possible to make very fundamental adjustments (e.g. of CPU register contents or memory contents) to the device under test without relying on any software on the device under test.

In contrast, the optional high bandwidth interface allows for a very fast exchange of data between the automated test equipment and the device under test, wherein typically an operating system or a driver software which is executed on the device under test supports the communication.

Accordingly, the automated test equipment comprising the on-chip system test controller can efficiently perform fundamental hardware tests, which may, for example, be performed using a scan chain of the device under test, and system level tests in which there is an exchange of a large amount of data between the device under test and the automated test equipment. For example, the debug interface may be used to configure tests and to control a basic test flow. In a simple embodiment, in which there is no high bandwidth interface, the debug interface can also be used to upload larger test programs and/or test data and/or test parameters via the debug interface or control interface.

However, in case the on-chip-system test controller also comprises the optional high bandwidth interface, larger test programs and/or test data may be communicated via the high bandwidth interface, thereby increasing test efficiency and reducing test time.

It should be noted here that the high bandwidth interface may, for example, be able to handle a data rate which is at least 10 times higher than a (maximum) data rate of the debug interface or control interface, and which may, in some cases, even be at least 100 times faster than a (maximum) data rate handled by the debug interface or control interface. However, the dedicated on chip system test controller is typically designed to handle the very high data rates of the high bandwidth interface without problems while still having "full access" to the device under test via the debug interface or control interface.

In a preferred embodiment, the automated test equipment is configured to variably allocate the debug interface or the control interface or the high bandwidth interface to a device-under-test interface.

By variable allocating the debug interface or the control interface or the high bandwidth interface to a device-under-test interface, the automated test equipment is configurable to handle arbitrary devices under test and/or arbitrary load boards. For example, the automated test equipment may be designed such that it is possible to variably allocate the debug interface or the control interface to different pins of a device-under-test interface (e.g. under the control of test configuration information), and the automated test equipment may also be adapted to variably allocate the high bandwidth interface to different pins of the device under test interface (e.g. under the control of test configuration information). Thus, a high degree of flexibility is achieved.

In a preferred embodiment, the automated test equipment is configured to variably allocate one or more parametric test resources to the device under test.

By variably allocating one or more parametric test resources to the device under test, e.g. under the control of the on-chip-system test controller, it is possible to significantly increase a test coverage.

The one or more parametric test resources may, for example, comprise one or more adjustable device power supplies and/or one or more adjustable clock sources. Accordingly, it is possible to test the device under test over a very wide range of conditions, which allows to identify a large number of defects or problems of the device under test. Moreover, the one or more parametric test resources may also comprise signal generators which may, for example, provide analog signals or radio frequency signals to the device under test using adjustable parameters. Accordingly, the device under test can be tested with different stimulus under the control of the on chip system test controller which can control a test flow using the debug interface or control interface and also using the high bandwidth interface.

Moreover, the one or more parametric test resources may also comprise one or more measurement devices which can characterize analog properties of signal inputs of the device under test and/or of signal outputs of the device under test and/or of signals generated by the device under test. Accordingly, the on chip system test controller can, for example, control an upload of test programs into the device under test, an execution of test programs on the device under test and also a variation of operation conditions (like, for example, a supply voltage or a clock frequency) of the device under test. Thus, the impact of changed operating conditions onto the device under test can be investigated and analog (parametric) test results can be obtained in synchronization with the execution of a test program on the device under test.

In a preferred embodiment, the on-chip-system-test controller is configured to run a software stack comprising an operating system, an on-chip-system test service software, and one or more drivers for communicating with the device under test through the interfaces.

By using an operating system, an on chip system test service software and drivers for communicating with the device under test through the interfaces, the on chip system test controller can be adapted to varying requirements in a very efficient manner. The usage of an operating system allows for very efficient software development, and the usage of drivers for communicating with the device under test through the interfaces brings along a very high performance and also allows for an adaptation to different types of interfaces with moderate effort and without redesigning the full software environment.

In a preferred embodiment, the on-chip-system test controller is configured to run application-specific routines provided by a user (e.g. which goes beyond the operating system, and which is adapted to a specific device under test).

By allowing the execution of application-specific routines which may be provided by a user of the automated test equipment, a very high degree of freedom may be provided to the user. In particular, the user cannot only develop application-specific routines which run on the device under test but also application-specific routines which are executed by the on-chip-system-test controller. Thus, the user of the automatic test equipment can generate routines which are executed by the on-chip-system test controller and which are in communication with routines running on the device on test, for example using the high bandwidth interface of the on-chip-system test controller. Thus, tests can be significantly improved and the user of the automated test equipment has a very flexible access to any hardware resources controlled by the on-chip-system test controller.

In a preferred embodiment, the on-chip-system test controller is configured to load an on-chip-system-test environment (e.g. a software controlling an execution of one or more on-chip system tests, which may, for example, provide drivers for accessing interfaces of the DUT) onto a device-under-test (e.g. via one or more device-under-test interfaces). For example, the on-chip system test environment, e.g. a program implementing the on-chip-system-test environment, is stored in a memory of the on-chip system test controller.

Alternatively, or in addition, the on-chip-system test controller is configured to load an on-chip-system-test (e.g. an individual on-chip-system test program for performing one test step, out of a plurality of test steps) onto a device-under-test (e.g. via one or more device-under-test interfaces). For example, the on-chip-system test, e.g. a program implementing the on-chip-system-test, is stored in a memory of the on-chip system test controller.

Alternatively, or in addition, the on-chip-system test controller is configured to initialize an on-chip-system-test environment on a device-under-test.

By loading an on-chip-system test environment onto a device under test, the on-chip-system test controller can configure the device under test for the testing. For example, the on-chip-system test environment may be a software that is in communication with the on-chip-system test controller, such that the on-chip-system test controller has an impact on the execution of tests on the device under test. Moreover, it should be noted that the upload of such an on-chip system test environment from a memory of the on-chip-system test controller is typically very fast, wherein it should be noted that the on-chip-system test environment may comprise a remarkable amount of data. Thus, by directly using the memory of the on-chip-system test controller, bottle necks in an automated test equipment can be avoided, in particular, when testing multiple devices under test, because the on-chip-system test controller typically has direct access to the debug interface or the control interface and to the high bandwidth interface. Accordingly, the on-chip-system test controller may even use the high bandwidth interface for uploading the on-chip-system test environment to the device under test.

To conclude, using such a concept, a simultaneous test of multiple devices under test is facilitated and a close cooperation between the device under test and the on-chip-system test controller can be achieved.

Similarly, uploading a single on-chip-system test onto the device under test under the control of the on-chip-system test controller allows to adjust the test procedure in a fine-granular manner. Thus, the on-chip-system test controller may, for example, load a new on-chip-system test (i.e., an individual on-chip-system test program for performing one test step, out of a plurality of test steps) and, optionally, its test parameters whenever a previous test step has been completed.

The on-chip-system test may, optionally, determine that the on-chip-system-test is already loaded and may only set new test parameters for the on-chip-system test.

Optionally, the on-chip-system test controller may also dynamically adapt the on-chip-system test which is loaded onto the device under test in accordance with previous test results, which allows for a particularly well-adapted testing.

Moreover, by initializing the on-chip-system test environment on the device under test, the on-chip-system test controller can prepare the device under test for the testing and configure a test flow. Moreover, by initializing the on-chip-system test environment, the on-chip test controller may, for example, control a timing of the tests, for example, in order to synchronize a testing of multiple devices under test.

In a preferred embodiment of the automated test equipment, the on-chip-system test controller is configured to upload a parameter set, which parametrizes an on-chip system test, onto a device-under-test. For example, the on-chip-system test controller may also be configured to initiate a re-execution of a previously uploaded on-chip-system test (which has been executed by the device under test before using another parameter set) using the newly uploaded parameter set, to thereby cause an execution of the on-chip-system test with different parameter sets.

Accordingly, it is possible to execute an on-chip-system test multiple times with different parameter sets without uploading the full on-chip-system test to the device under test multiple times. Rather, a program code portion of the on-chip-system test is only uploaded to the device under test once, and a parameter set, which is used to parametrize the execution of the on-chip-system test is updated after the execution of the on-chip-system test. However, an amount of data (e.g. parameter values) making up the parameter set is typically much smaller than an amount of date (e.g. program code) making up the on-chip-system test itself. Moreover, it should be noted that the parameter sets, parametrizing the on-chip-system test, may be predetermined (e.g. may be predetermined by a test flow) or may be adapted dynamically (e.g. by the on-chip-system-test controller) in response to result data from the device under test. Thus, a typical procedure may comprise an upload of an on-chip-system-test to the device-under test, an upload of a first set of parameters to the device under test, an execution of the on-chip system test on the device under test using the first parameter set, a provision of result information to the on-chip-system test controller, an upload of a second parameter set (second set of parameters) to the device under test, a re-execution of the on-chip-system test on the device under test (without a re-upload of the on-chip system test) using the second parameter set, and another provision of result information to the on-hip-system-test controller.

For example, the parameter sets may comprise one or more parameters defining an amount of data to be processed in a run of an on-chip system test, and/or a number of device-under-test components to be activated simultaneously (which defines a stress applied to the device under test), and/or a data rate of data transferred via an interface, and/or parameters of an analog interface (e.g. frequency parameters or modulation parameters of a high-frequency interface), and/or other parameters describing a stress generated during the execution of an on-chip-system test and/or parameters describing a test coverage of dut components during the execution of an on-chip-system test, or the like.

To conclude, according to an aspect of the invention, it is possible to load test parameters onto the DUT independent of loading the on-chip-system test itself: e.g. an OCST (e.g. a previously loaded OCST) may stay loaded, but prior to its next execution (e.g. re-execution) the parameters may be changed. This is more efficient and typically done, for example, when characterizing an OCST.

In a preferred embodiment, the on-chip-system test controller is configured to start an on-chip-system test (e.g. a specific OCST) loaded onto a device under test (for example, using a communication with the on-chip-system test environment, or using a debug interface).

By starting an on-chip-system test, the on-chip-system test controller can exercise a high degree of control over the test flow. For example, the on-chip-system test controller can start the on-chip-system test using the debug interface (or control interface) or even using a data transmission via the high bandwidth interface. Accordingly, the on-chip-system test controller can coordinate an execution of test of multiple devices under test, and the on-chip-system test controller can also coordinate an execution of an on-chip-system test on a device under test with other tester resources.

In a preferred embodiment, the on-chip-system test controller is configured to control the test of the device-under-test on the basis of an overall test execution program (e.g. programmed by a user) in a test sequencing language (e.g. a universal test sequencing language).

By controlling the test of the device under test on the basis of an overall testing execution program, the on-chip-system controller may, for example, guide an execution of multiple on-chip-system tests, wherein, for example, certain abort criteria may be evaluated in order to avoid further tests if a previous test has failed. Moreover, by processing an overall test execution program in a test sequencing language, a high degree of flexibility is available in the configuration of the overall test flow.

In a preferred embodiment, the on-chip-system test controller is configured to control one or more analog test resources (e.g. a device-under-test power supply and/or an analog measurement unit), e.g. directly, e.g. without communication with a higher level software which is subordinated over the on-chip-system test controller and the one or more analog test resources (or which is hierarchically above the on-chip-system test controller and the one or more analog test resources).

Alternatively, or in addition, the on-chip-system test controller is configured to control, in addition to the interfaces, one or more digital test resources (e.g. a digital output or a digital input), e.g. directly, e.g. without communication with a higher level software which is subordinated over the on-chip-system test controller and the one or more digital test resources (or which is hierarchically above the on-chip-system test controller and the one or more digital test resources).

Alternatively, or in addition, the on-chip-system test controller is configured to synchronize one or more analog test resources (e.g. a device-under-test power supply and/or an analog measurement unit) e.g. directly, e.g. without communication with a higher level software which is subordinated over the on-chip-system test controller and the one or more analog test resources (or which is hierarchically above the on-chip-system test controller and the one or more analog test resources).

Alternatively, or in addition, the on-chip-system test controller is configured to synchronize, in addition to the interfaces, one or more digital test resources (e.g. a digital output or a digital input), e.g. directly, e.g. without communication with a higher level software which is subordinated over the on-chip-system test controller and the one or more digital test resources (or which is hierarchically above the on-chip-system test controller and the one or more digital test resources).

By directly controlling one or more analog test resources or one or more digital test resources, without communication with a higher level software, bottle necks can be avoided, which is particularly important if multiple devices under test are tested at the same time. Accordingly, the on-chip-system test controller can execute at least portions of a test flow without interaction with higher level software (for example, running on a workstation controlling the overall test process). For example, the on-chip-system test controller may be coupled to one or more digital test resources and/or to one or more analog test resources using connection resources that are "dedicated" to the on-chip-system test controller or that are not shared between different on-chip-system test controllers. Alternatively, the on-chip-system test controller may be coupled with one or more analog test resources and/or one or more digital test resources via connection resources that are shared with one or more other on-chip-system test controllers, but which can be used under the control of the on-chip-system test controller without involving a higher (hierarchical) level component or a higher (hierarchical) level software. Consequently, the speed of test can be increased and it can be avoided that there is a bottle neck.

Similarly, by having an on-chip-system test controller that is configured to synchronize one or more digital test resources and/or one or more analog test resources, the complete test of a device under test can be performed with a high timing accuracy. In particular, by having the functionality to synchronize one or more analog test resources and/or one or more digital test resources, the on-chip-system test controller can perform a test of the device under test, wherein an adaptation of a generation of analog qualities or a measurement of analog quantities or a generation of digital stimulus signals or a capture of digital output signals (which may be performed by the one or more analog test resources and/or the one or more digital test resources) can be closely time-synchronized with an execution of one or more on-chip-system tests, which are also (at least partly) controlled by the on-chip-system test controller. In other words, the on-chip-system test controller can act as a decentral control entity which is close to the individual device under test and which can accurately synchronize both a program execution on the device under test and additional test resources (analog test resources and/or digital test resources).

In a preferred embodiment, the on-chip-system test controller comprises a local communication interface to control one or more analog test resources and/or one or more digital test resources. Alternatively, or in addition, the on-chip-system test controller comprises a local synchronization interface to synchronize one or more analog test resources and/or one or more digital test resources (e.g. directly connecting the on-chip-system test controller to the analog test resources and/or to the digital test resources).

By using a local communication interface and/or a local synchronization interface, which is, for example, not shared with any other on-chip test controllers, high timing accuracy can be ensured and an influence between different on-chip system test controllers, which may simultaneously test different devices under test, can be avoided. Consequently, a high degree of timing accuracy and reproducibility can be achieved.

In a preferred embodiment, the on-chip-system test controller is configured to receive commands and/or data from an on-chip-system test running on the device under test, and to adapt a test execution flow in dependence on the received commands and/or the received data.

By adapting a test execution flow to commands and/or data from the on-chip system test running on the device under test, the development of the test program can be facilitated because the control over the test flow can, at least to some degree, be included in the program running on the device under test. On the other hand, the test flow can also be dynamically adapted to a non-deterministic execution of the program running on the device under test. In particular, when testing systems on a chip, which execute test programs, a timing of the test flow is no longer easily predictable. By providing the device under test with the possibility to have some control over the test flow by providing commands to the on-chip system test controllers, it can be achieved that the automated test equipment adapts to the non-deterministic execution of a program on the device under test. Consequently, the automated test equipment can provide the appropriate input signals to the device under test at the right time and/or can conduct measurements of signals provided by the device under test at the right time.

In a preferred embodiment, the on-chip system test controller is configured to receive commands and/or data from an on-chip-system test running on the device under test, and to adapt test resources (e.g. analog quantities, like one or more supply voltages, or one or more stimulus signals provided to the device-under-test, or one or more evaluation parameters, e.g. threshold values, for judging signals provided by the device-under-test) in dependence on the received commands and/or the received data.

By adapting test resources in response to a reception of commands and/or data from the device under test (which may be running a test program, i.e., an on-chip system test), a good coordination between the typically non-deterministic execution of the program on the device under test and the activities of the automated test equipment (e.g., provision of supply voltages or stimulus signals or evaluation of signals from the device under test) can be achieved.

In a preferred embodiment, the on-chip-system test controller comprises a central unit (e.g. a system SOC) configured to provide an embedded software environment and one or more interface blocks implementing the debug interface and/or the control interface and/or the high bandwidth interface.

The on-chip-system test controller comprises front-end electronics for providing one or more signals to the device under test and for receiving one or more signals from the device under test.

The on-chip-system test controller also comprises one or more backend interfaces configured to communicate with one or more other components of the automated test equipment and/or to synchronize with one or more other components of the automated test equipment.

By providing a central unit, front end electronics and also one or more back end interfaces on the on-chip system test controller, the on-chip-system test controller can efficiently execute at least part of a test flow independent from a higher level control. For example, the on-chip system test controller can receive configuration information from a higher level control via one of the back end interfaces, and can also control one or more other tester resources, for example a device power supply and/or one or more digital channels and/or one or more analog signal generation devices and/or one or more analog measurement devices. However, by having a front end electronics on the on-chip system test controller, the on-chip system test controller can, for example, receive the most time critical signals directly from the device under test and/or send the most time critical signals directly to the device under test, without involving any other components. In other words, the on-chip system test controller described above is able to execute some basic test functionalities independently from other test resources, but can still control such additional test resources to perform more elaborate tests (for example, varying a power supply voltage of the device under test or a clock frequency applied to the device under test, or any other additional parameters). To conclude, the on-chip system test controller described here can independently perform (or at least control) a large portion of a test flow which is used to test a device under test which is a system on a chip.

In a preferred embodiment, the automated test equipment comprises an interface to one or more development and debug environments.

By providing an interface to one or more development and debug environments, a development of a test program can be facilitated. In this regard, it should be noted that a development of a test program for a system on a chip is very challenging, since typically such a "test program" comprises both a test program portion to be executed on the device under test and a test program portion to be executed by the automated test equipment, or by the on-chip system test controller of the automated test equipment. Accordingly, since program code has to be developed for two physical entities (dut and automated test equipment), it is desirable to support such a development, which is often performed at least partially using third party software, by the automated test equipment.

The interface between the automated test equipment and the one or more development and debugging environments may, for example, allow a third party development and debugging environment to upload a program to the device under test using the on-chip system test controller (or generally speaking, using the hardware of the automated test equipment), and may also allow the development and debug environment to obtain debug information from the device under test via the on-chip system test controller (or, generally speaking, using the hardware of the automated test equipment). Furthermore, the interface between the automated test equipment and the development and debug environment may also provide the development and debug environment with information about the tester resources and/or with application programming interfaces to control one or more resources (e.g., analog resources or digital resources) of the automated test equipment. Generally speaking, the interface between the automated test equipment and the development and debug environment may provide the development and debug environment with one or more or even any of the (software) modules (like, for example, APIs) that are required for accessing tester resources or to coordinate activities of the device under test with activities of the automated test equipment. Moreover, access to program upload functionalities and/or debug information of the device under test may be provided by the interface, such that the software development and debugging can efficiently be performed using the third party development and debug environment.

In a preferred embodiment, the automated test equipment comprises a development and debug environment which is adapted to develop and debug both on-chip-system test software for execution on the device-under-test and a test program to be executed by the automated test equipment.

By providing a development and debug environment as part of the automated test equipment, which is adapted to develop and debug both the on-chip system test software for execution on the device under test and a test program to be executed by the automated test equipment, a development of test software can be significantly facilitated. In particular, a joint development and debug environment is provided which provides corresponding (mating) routines for an exchange of control information or data between the automated test equipment and the device under test. Since the joint development and debug environment may be aware of the interfaces between the automated test equipment and the device under test, the joint development and debug environment may even allow access to the same variables both on the side of the device under test and on the side of the automated test equipment, wherein a communication of these variables from the device under test to the automated test equipment or vice versa may be handled automatically by the joint development and debug environment, for example, by the insertion of corresponding communication code portions into the on-chip system test software for execution on the device under test and into the test program to be executed by the automated test equipment. Thus, by handling a software development for both sides of a communication relationship (i.e., for the device under test and for the automated test equipment), in a joint development and debug environment, a development process may be simplified significantly, and a software developer may be provided with a homogenous environment using common variable names, interface names, and so on.

In particular, the joint debug and development environment may provide tools to introduce code portions for a single action (for example, communication of data from the device under test to the automated test equipment) in response to a single user interaction indicating that such an action is desired. Consequently, it is no longer necessary for a software developer to switch between separate development environments using different programming concepts, variable names, APIs, and so on.

Furthermore, whenever a debug functionality (for debugging code on the device under test) is desired, the joint development debugged environment may automatically generate a code portion for a test program to be executed on the automated test equipment, for retrieving the debug information from the device under test and for forwarding said debug information to the joint development and debug environment. Consequently, the developer can focus on the question which debugging functionality is desired for the device under test, and the joint development and debug environment automatically generates program code for the automated test equipment that forwards the debug information from the device under test to the development and debug environment (e.g., via the on-chip system test controller).

To conclude, the usage of a development and debug environment, which targets both the on-chip system test software and the test program to be executed by the automated test equipment (e.g., by the on-chip system test controller) allows for a very efficient software development, while a development of both an on-chip system test software for execution on the device under test and of a test program to be executed by the automated test equipment would conventionally be very difficult for the test engineer.

In a preferred embodiment, the development and debug environment allows (e.g. provides an interface or API) for an access to test resources of the automated test equipment when developing and/or debugging on-chip-system test software to be executed on the device-under-test.

Allowing for an access to test resources of the automated test equipment strongly supports the developing and/or debugging of on-chip system test software, since an access to test resources of the automated test equipment may support an upload of program codes to the device under test, an upload of test parameters, a download of result information and a streaming of traces from the device under test into the development and debug environment, a coordination between a program execution on the device under test and an environment provided to the device under test by the automated test equipment, and so on. For example, the development and debug environment may provide an interface or an application programming interface (API), which allows, when included in a program running on a device under test, the device under test to access the tester resources and/or to communicate with the automated test equipment.

Consequently, the functionality of the automated test equipment can be exploited efficiently in the test of a DUT, and the DUT may even gain some control (or even full control) over the test resources of the automated test equipment, such that a development of a test program to be executed by the automated test equipment when testing the device under test can be simplified or even avoided.

In a preferred embodiment, the development and debug environment comprises a program code to allow for an access to a memory content (e.g. of a memory of the automated test equipment) from the on-chip-system via an interface (e.g. HSIO) of the automated test equipment.

By providing a program code that allows for an access to a memory content from the on-chip system (from the device under test) via an interface of the automated test equipment, the presence of a memory can be emulated. This is helpful in cases in which the device under test would normally be operated with some external memory that is not present in an actual test environment. In this case, the device under test may be enabled by the program code provided by the development and debug environment, to access a memory of the automated test equipment (e.g., of the on-chip system test controller) to effectively replace a memory that should normally be directly connected to the device under test. Accordingly, the device under test can still be operated reasonably even in situations in which it is not possible to provide an actual memory coupled directly to the device under test, wherein the program code that allows for an access to the memory content of a memory of the automated test equipment via the high speed input output interface or via the high bandwidth interface can act as a driver, to emulate the missing physical memory. In particular, said program code is typically aware how the memory content, which is typically stored in the memory of the on-chip system test controller, can be accessed (e.g., addressed) via the interface (e.g., high speed 10 or high bandwidth interface) and therefore allows the device under test to correctly access the memory content when the program code is executed on the device under test. Consequently, the emulation of the memory is substantially transparent to a programmer who develops a program for the device under test, since the development and debug environment of the automated test equipment is responsible for the provision of appropriate emulation program code.

In a preferred embodiment, the development and debug environment comprises an interface to allow a debug software to control an upload of a program onto the device under test (e.g. onto an on-chip-system).

By providing an interface to allow a debug software to control an upload of a program onto the device under test, it is possible to use a third party development software or debug software which may be familiar to the software engineer developing a program code for the device under test. Accordingly, the software engineer can test and debug a software for the device under test even when the device under test is placed in the test environment (i.e., coupled to the on-chip system test controller).

In a preferred embodiment, the development and debug environment comprises an interface to allow a debug software to access a debug interface (e.g. JTAG) of the device under test (e.g. onto an on-chip-system).

By providing an interface to allow a debug software to access a debug interface of the device under test, a debugging using third party debug software can be enabled in a case that the device under test is placed in the actual test environment (e.g., coupled to the on-chip system test controller). Thus, the debugging of an on-chip system test to be executed by the device under test can be performed under the real testing conditions.

In a preferred embodiment, the development and debug environment is configured to provide a debug software direct access (e.g. avoiding or bypassing the development and debug interface) to a debug interface (e.g. JTAG) of the device under test (e.g. onto an on-chip-system). For example, the direct access may be provided by switching a JTAG connection of the DUT between a path through the on-chip-system test controller and the development and debug environment and a direct path, e.g. bypassing the on-chip-system test controller and the development and debug environment, towards the debug software.

By providing direct access to the debug interface, any latencies which may be caused by a forwarding of the debug interface through the on-chip system test controller can be avoided. Also, debug software which is not capable of dealing with an interface of the automated test equipment to access the debug interface of the device under test can also be used. In other words, by providing access to the debug interface of the device under test, which bypasses the on-chip system test controller and the development and debugging environment of the automated test equipment, a maximum compatibility with the third party debug software can be maintained.

In a preferred embodiment, the development and debug environment comprises an application programming interface for usage in a development of on-chip-system software, to allow for a communication between the device-under test and test resources of the automated test equipment when the developed on-chip-system test software is executed on the device-under-test (e.g. in order to receive test parameters form the automated test equipment and/or in order to send control commands to the automated test equipment or to the on-chip-system test controller).

By providing such an application programming interface in the debug environment, it is easily possible to develop on-chip system test software which is executed on the device under test and which communicates with the automated test equipment. Based on the knowledge of the behavior of the test resources of the automated test equipment, the application programming interface can be provided such that the application programming interface perfectly fits the test resources of the automated test equipment. Thus, a developer of an on-chip system test software to be executed on the device under test does not need detailed knowledge about the automated test equipment but can simply rely on the application programming interface, which represents the test resources of the automated test equipment in an abstract manner. Also, it is possible to modify details of the test resources of the automated test equipment without redesigning the on-chip system test software. Rather, in such a case it is only necessary to adapt the application programming interface. Moreover, it is also easily possible to switch between different interfaces between the device under test and the automated test equipment, for example, if the application programming interfaces are designed to be independent from the actual physical implementation of the interface or if application programming interfaces associated with different types of interfaces are similar. Accordingly, the development of an on-chip system test software is facilitated which also saves costs.

In a preferred embodiment, the development and debug environment also comprises tester software to support communication of the automated test equipment with a device under test running the developed on-chip-system test software (which uses said application programming interface).

By also providing a test software to support communication of the automated test equipment with the device under test, the debug and development environment allows for a simple communication between the device under test and the automated test equipment. In particular, it is possible to easily develop, in a well-synchronized manner, on-chip system test software to be executed on the device under test and also tester software. In particular, it should be noted that communication between the device under test and the automated test equipment requires "mating" on-chip system test software to be executed on the device under test and tester software to be executed, for example, by the on-chip system test controller. In particular, the development and debug environment can provide such "mating" software components, both for the device under test and for the automated test equipment, and may therefore allow for a rapid development of functional test software.

In a preferred embodiment, the development and debug environment comprises an program (e.g. an "OCST test runner") for usage in a development of on-chip-system test software (e.g. for inclusion into the on-chip-system test software), to allow for an upload of further software (e.g. further on-chip-system test software) from the automated test equipment to the device-under-test and/or to allow for controlling of a program execution on the device under test (e.g. of an on-chip-system test software) by the automated test equipment.

By providing a program code that allows for an upload of further software from the automated test equipment to the device under test and/or that allows for controlling a program execution on the device under test, several issues that occur when testing a system on a chip can be resolved. For example, there is typically insufficient memory on the device under test to upload the full on-chip system test software (to be executed on the device under test) in a single step. Accordingly, by providing a program that handles a "dynamic" loading of software onto the device under test (from a memory of the automated test equipment, e.g., of the on-chip system test controller), a test of the device under test can be supported. In that such software routine is provided by the debug and development environment, a software engineer developing the on-chip system test software can fully concentrate on the actual on-chip system test routines. Moreover, by also providing a program that allows for controlling a program execution on the device under test by the automated test equipment, an overall control of the test execution can be performed by the automated test equipment (e.g., by the on-chip system test controller). Thus, the on-chip system test controller can easily coordinate the execution of on-chip system test software on the device under test with additional functionalities of the automated test equipment (e.g., analog test resources and/or digital test resources). In particular, by providing such software modules in the development and debug environment of the automated test equipment, a software engineer developing the on-chip system test software does not need to be aware of details regarding the mechanisms for controlling the device under test by the automated test equipment which facilitates and accelerates software development.

In a preferred embodiment, the development and debug environment comprises a program (e.g. an "OCST test runner") for usage in a development of on-chip-system test software (e.g. for inclusion into the on-chip-system test software), to supervise a program execution on the device under test (e.g. of an on-chip-system test software), e.g. by implementing a watchdog functionality, and, optionally, to assure responsiveness of the device under test.

By providing a program to supervise a program execution on the device under test, malfunctions of the device under test can be easily detected. For example, said program, which is provided by the development and debug environment for usage in a development of on-chip system test software, may take over the functionality of a "watchdog", i.e., recognize if an on-chip system test program, which is executed on the device under test, "gets stuck", i.e., stops to function properly. Such an abortion of the program execution may indicate a problem of the device under test, and the watchdog program may signal such an event, for example, to the automated test equipment. Accordingly, the automated test equipment may respond accordingly, for example by aborting a test of the device under test and by marking the device under test as failing. Thus, test time may be saved by quickly recognizing the device under test failure using such a supervision program or watchdog program. Again, a software engineer may not need to worry about details, since the program is provided by the development and debug environment of the automated test equipment.

In a preferred embodiment, the automated test equipment is configured to synchronize one or more tester resources, the on-chip-system test controller and an on-chip-system test executed on the device under test.

By synchronizing one or more tester resources, the on-chip system test controller and an on-chip system test executed on the device under test, a test can be performed which exploits a cooperation between the on-chip system test controller, one or more additional tester resources and the device under test. In other words, resources of the automated test equipment can be applied when performing the on-chip system test, which results in a particularly thorough testing.

In a preferred embodiment, the automated test equipment is configured to perform conditional jumps (e.g. in a test program performed by the automated test equipment) responsive to control information provided by the on-chip-system test running on the device under test.

By performing conditional jumps responsive to control information provided by the on-chip system test running on the device under test, the operation of the automated test equipment can be adapted to an non-deterministic behavior (e.g., non-deterministic or non-predictable timing) of the on-chip system test running on the device under test. For example, it may not be known in which order the portions of an on-chip system test running on the device under test will be executed because this may be dependent on factors that are difficult to predict or that are even unpredictable. Accordingly, the device under test may provide control information to the automated test equipment, to signal details regarding the execution of the on-chip system test, to thereby allow the automated test equipment to reply accordingly (e.g., by providing appropriate stimulus signals).

Thus, the automated test equipment can well-adapt to the non-deterministic nature of the on-chip system test.

In a preferred embodiment, the automated test equipment is configured to wait for a completion of an on-chip-system test running on the device under test.

By waiting for the completion of an on-chip system test running on the device under test, a synchronism between the (typically non-deterministic) execution of the on-chip system test and the functionality of the automated test equipment can be achieved.

BRIEF DESCRIPTION OF THE FIGURES

Embodiments according to the present invention will subsequently be described taking reference to the enclosed figures in which.

DETAILED DESCRIPTION OF THE EMBODIMENTS

1. Automated Test Equipment According to FIG. 1

Figure 1:
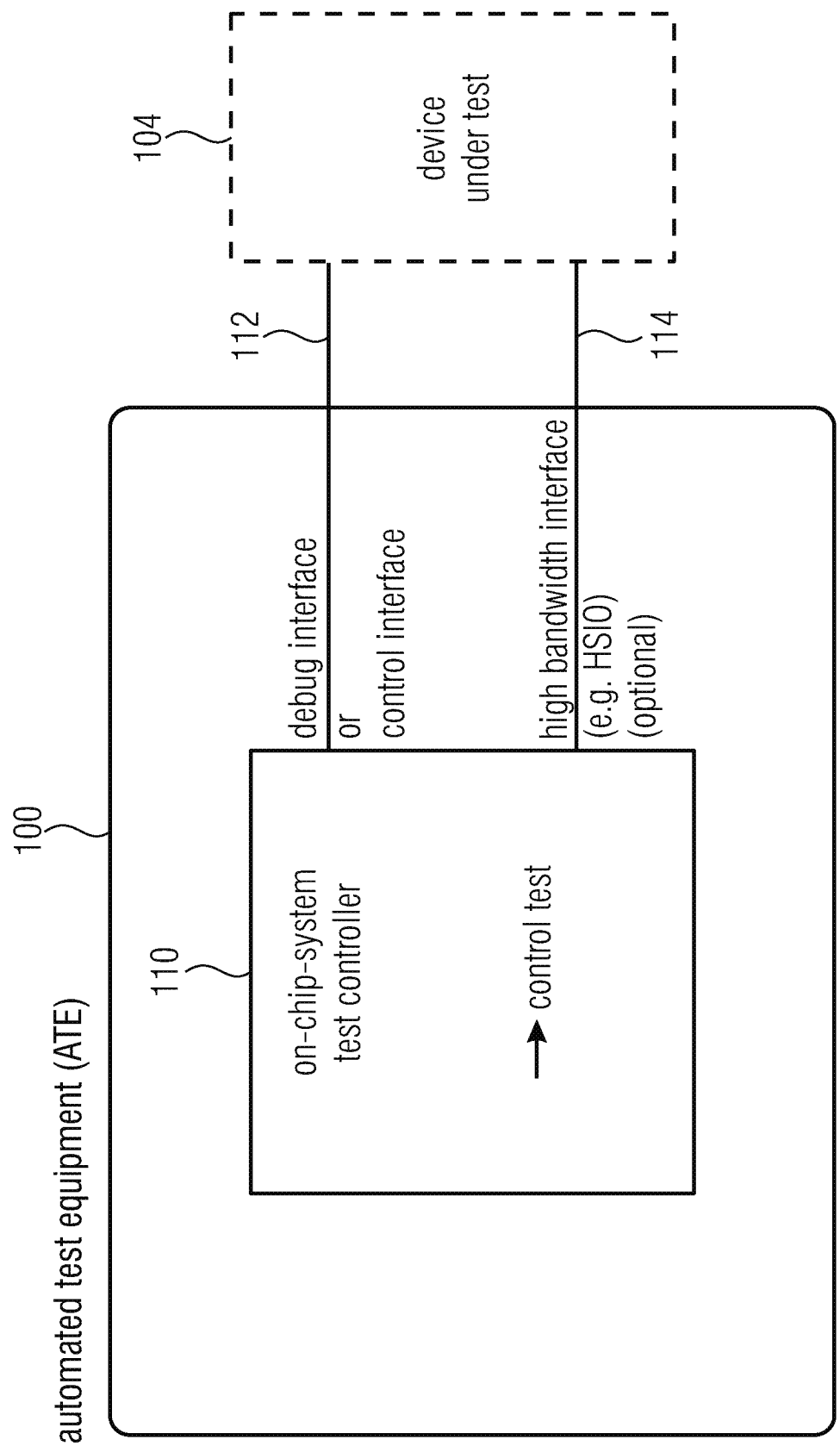
FIG. 1 shows a block schematic diagram of an automated test equipment, according to an embodiment of the present invention.

FIG. 1 shows a block schematic diagram of an automated test equipment 100, according to an embodiment of the present invention. It should be noted that the automated test equipment 100 is adapted for testing a device under test 104, which may, for example, be a system-on-chip (SoC).

The automated test equipment 100 comprises an on-chip system test controller 110. The on-chip system test controller 110 comprises at least one debug interface or control interface 112 which is configured to communicate with the device under test 104. Moreover, the on-chip system test controller 110 optionally also comprises at least one high bandwidth interface 114 (which may, for example, be a USB interface, or a PCI interface, or a PCI-express interface, or a PCI-express compliant interface, or a thunderbolt interface, or an Ethernet interface, or an IEEE-1394 interface, or a SATA interface or an IEEE-1149 interface or an IEEE-1500 interface, or an IEEE-1687 interface).

Moreover, it should be noted that the on-chip system test controller 110 is configured to control the test of the device under test 104 which is a system-on-chip.

By having two or more different interfaces available for a communication with the device under test 104, the on-chip system test controller 110 may be able to control the device under test 104 on a very low level, e.g. a hardware level (for example, via a debug interface which has direct access to a hardware component of the device under test) and the on-chip system test controller is also capable to communicate large amounts of program code or data towards the device under test 104 at high speed via the high bandwidth interface. Thus, the on-chip system test controller can manage both testing tasks which require low level hardware access to the device under test (preferably using the debug interface or control interface 112) and testing tasks which require high bandwidth communication which is typically controlled by a software (e.g., an on-chip system test program) which is executed on the device under test 104. Thus, a high coverage test of the device under test can be performed under the control of the on-chip system test controller 110.

Moreover, by using a dedicated on-chip system test controller 110, which comprises the debug interface or control interface 112 and the high bandwidth interface 114 to control the test, bottlenecks can be avoided in the automated test equipment and a high degree of synchronism between control exercised using the debug interface or control interface 112 and data exchange using a high bandwidth interface 114 can be achieved. Thus, having an on-chip system test controller 110 which comprises both the interface 112 and the interface 114, a highly efficient structure is provided.

Moreover, it should be noted that the automated test equipment 100 can optionally be supplemented by any of the features, functionalities and details disclosed herein, both individually and taken in combination.

2. Automated Test Equipment According to FIG. 2

Figure 2:
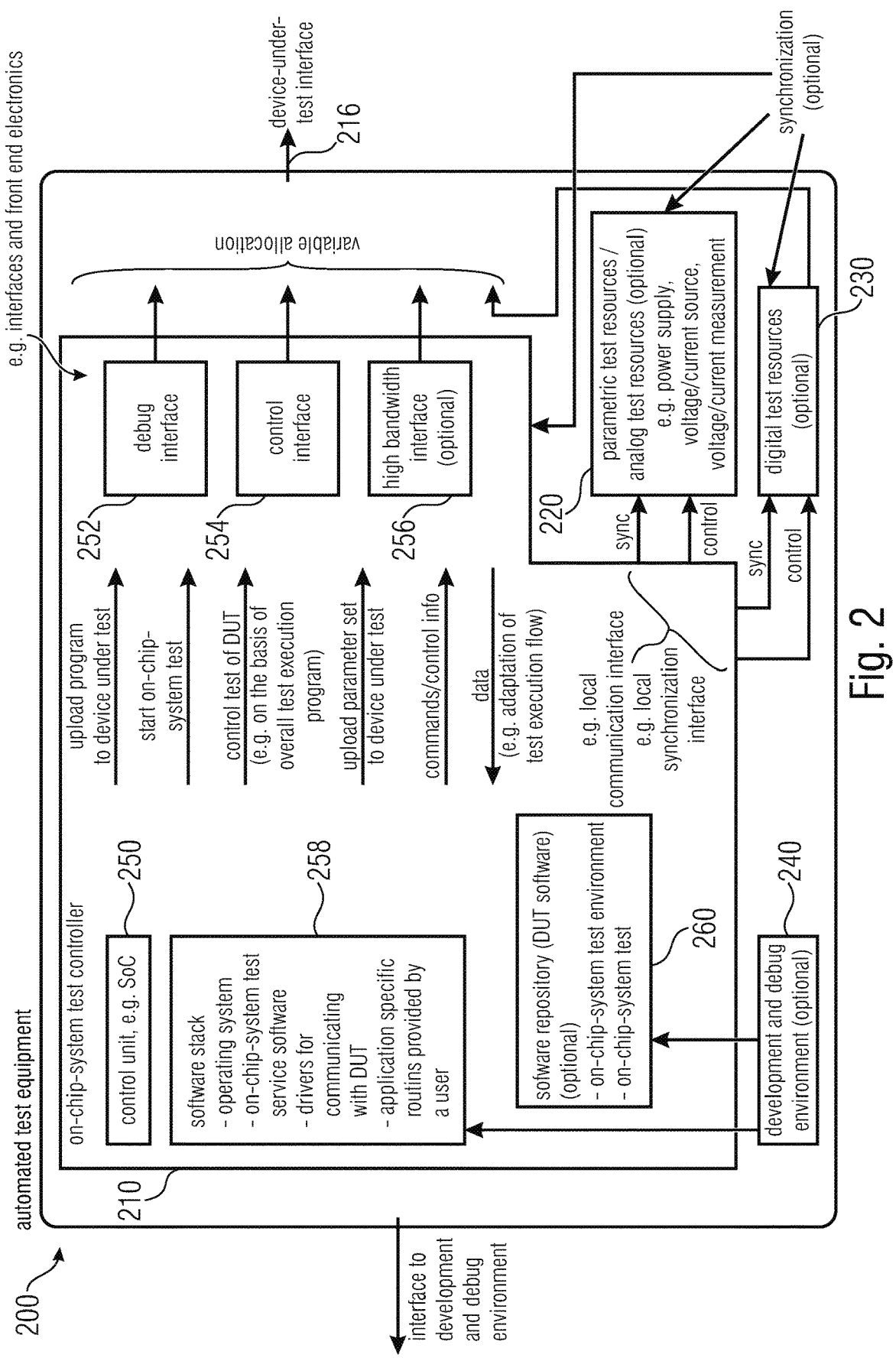
FIG. 2 shows a block schematic diagram of an automated test equipment, according to an embodiment of the present invention.

FIG. 2 shows a block schematic diagram of an automated test equipment 200 according to an embodiment of the present invention.

The automated test equipment 200 comprises an on-chip system test controller 210 which may, for example, correspond to the on-chip system test controller 110. Moreover, the automated test equipment 200 comprises a device under test interface 216 which may, for example, combine the functionality of interfaces 112, 114. The automated test equipment 200 further comprises one or more parametric test resources or analog test resources 220 and one or more digital test resources 230. The automated test equipment further comprises a development and debug environment 240.

In the following, the on-chip system test controller 210 will be described in more detail. The on-chip system test controller 210 comprises, for example, a central unit 250 which may, for example, be a system-on-chip. However, the central unit 250 may also be implemented using a microprocessor, using an application-specific individual circuit, or using a field programmable gate array. The on-chip system test controller 210 further comprises a debug interface 252, a control interface 254 and, optionally, a high bandwidth interface 256. Furthermore, the on-chip system test controller comprises a software stack 258 which may be executed by the central unit 250 or even by multiple central units or central processing units. Moreover, the on-chip system test controller 210 may comprise a software repository 260 which comprises DUT software, i.e., software to be executed by a central processing unit of the device under test.

However, it should be noted that the on-chip system test controller does not necessarily need to have all the components 250, 252, 254, 256, 258, 260. Rather, optionally, one or more of said components can be omitted or altered.

In the following, some additional details of the different components will be described.

In particular, it should be noted that signals provided by the debug interface 252 to the device under test or signals received by the debug interface 252 from the device under test may be variably allocated to the device under test interface 216, for example, using a configurable routing matrix. Similarly, one or more signals provided by the control interface 254 to the device under test and/or one or more signals received by the control interface 254 from the device under test may be variably allocated to the device under test interface 216. Similarly, one or more signals provided by the high bandwidth interface 256 to the device under test and/or one or more signals received by the high band interface 256 from the device under test can be variably allocated to the device under test interface 216. Accordingly, the on-chip system test controller (or, generally, the automated test equipment) may variably allocate one or more device-under-test ports of the debug interface 252 and/or of the control interface 254 and/or of the high bandwidth interface 256 to pins of the device-under-test interface 216, for example, using an adjustable routing matrix.

The software stack 258, which may be executed, for example, by the central unit 250, may comprise a plurality of layers. For example, the software stack may comprise an operating system, an on-chip system test service software, and drivers for communicating with the device under test. For example, the operating system may control the overall execution of the software. The on-chip system test service system software may, for example, control a communication with other tester resources (or test resources) and/or with a higher-hierarchical-level controller (for example, a work station controlling an overall test process). The on-chip system test service software may, for example, perform an evaluation of test results on the basis of data obtained from the device under test.

The drivers, which are also part of the software stack 258, may, for example, control a communication with the device under test via the debug interface 252 and/or via the control interface 254 and/or via the high bandwidth interface 256. In some cases, the drivers may even be designed to provide a common interface to high level software in dependent on the actual type of the physical interface. Thus, a driver may, for example, "hide" the actual type of high bandwidth interface to the higher level software, such that it is not necessary to adapt high level software to a specific type of high bandwidth interface.

Accordingly, the drivers help to keep a software development simple and avoid the need for the software designer to know details about the physical interface between the on-chip system test controller and the device under test. Moreover, the software stack 258 may also comprise one or more application specific routines provided by a user. The application specific routines provided by the user may be adapted to a testing of a specific type of device under test. The application specific routines provided by a user may rely on functions provided by the operating system and may also be able to communicate with the device under test using the drivers of the software stack.

It should be noted here that the on-chip system test controller 210 may perform a high degree of interaction and communication with the device under test, for example, using the software stack 258. For example, the on-chip system test controller 210 may upload one or more programs and/or test parameter sets to the device under test, wherein the debug interface 252 and/or the control interface 254 and/or the high bandwidth interface 256 may be used to upload one or more programs and/or test parameter sets to the device under test via the device under test interface 216. For example, the one or more programs and/or test parameter sets to be uploaded to the device under test may be taken from the software repository 260, which may be part of the on-chip system test controller, and which may store dut software. For example, the on-chip system test controller may be configured to upload an on-chip system test environment to the device under test and may also be configured to upload one or more on-chip system tests to the device under test via the device under test interface 216. For example, the on-chip system test environment may take the role of an operating system on the device under test and may, for example, provide one or more drivers on the device under test for communicating with the automated test equipment. Moreover, the individual on-chip system tests may, for example, define steps (or substeps) of an overall test procedure executed for testing the device under test.

Moreover, the on-chip system test controller 210 may, for example, start one or more on-chip system tests, wherein different concepts may be applied. The one or more on-chip system tests may, for example, be triggered (or started) by a hardware access to the device under test, which may be performed, for example, via the debug interface 252 (and which may, for example, one or more registers of a CPU of the device under test). Alternatively, one or more on-chip system tests may be started by providing a corresponding command to the on-chip system test environment, which is initially uploaded to the device under test and runs on the device under test.

Moreover, the on-chip system test controller may also control a test of the device under test, for example, on the basis of an overall test execution program. For example, the on-chip system test controller 210 may adjust parameters for the on-chip system test programs, schedule an execution of a plurality of on-chip system test programs, abort an execution of one or more on-chip system test programs, if appropriate, and so on.

Moreover, the on-chip system test controller 250 may also upload further on-chip system test programs in response to a completion of one or more previously executed on-chip system test programs.

The control of the test of the device under test may be performed via a hardware level access to the device under test (e.g., via the debug interface) and/or using commands which are sent to an on-chip system test environment that runs on the device under test.

Moreover, the on-chip system test controller 210 may also receive commands and/or control information from the device under test via one of the interfaces 252, 254, 256 and react to said commands and/or control information. For example, the device under test may request an adaptation of certain test conditions (for example, a supply voltage or a clock frequency) and the on-chip system test controller 210 may respond to such commands or control information by adapting the test environment appropriately.

Moreover, the on-chip system test controller 210 may also receive data from the device under test (for example, using one of the interfaces 252, 254, 256). The on-chip system test controller 210 may use said data to decide whether the device under test fulfils the requirement (i.e., to decide whether the device under test should be classified as being acceptable or as failing). Moreover, the on-chip system test controller may also use the data received from the device under test in order to adapt a test execution flow in dependence on the data. For example, a test execution flow may be adapted in response to a comparison of the data received from the device under test with reference data. For example, the data received from the device under test may characterize a test execution and may, for example, describe characteristics of signals received by the device under test (like, for example, a signal-to-noise ratio, a bit-error-rate, or the like). For example the adaptation of the test flow may be performed by the application specific routines provided by the user. However, different concepts are possible for adapting the test flow execution in dependence on data received from the device under test.

However, it should be noted that the on-chip system test controller 210 does not necessarily need to implement all of the functionalities described herein. Rather, in some embodiments, it may be sufficient if the on-chip system test controller implements one or more of the functionalities described here. On the other hand, the on-chip system test controller could also have different functionalities which are not described here.

Moreover, it should be noted that the on-chip system test controller may also control and/or synchronize one or more additional test resources. For example, the on-chip system test controller may control and/or synchronize one or more parametric test resources or analog test resources 220, like, for example, a power supply, a voltage source, a current source, a voltage measurement device or a current measurement device. For example, the on-chip system test controller may control the one or more parametric test resources in dependence on a program executed by the central unit 250 of the on-chip system test controller. The on-chip system test controller may, for example, decide on its own its own how to set the one or more parametric test resources, or the on-chip system test controller may set the one or more parametric test resources in dependence on commands or control information received from the device under test (i.e., in response to a request from the device under test). However, it should be noted that the parametric test resources or analog test resources may also comprise a generation of radio frequency signals or a reception and/or evaluation of radio frequency signals. Similarly, the parametric test resources thus comprise a generation or reception or evaluation of optical signals which are used when testing the device under test.

Similarly, the on-chip system test controller may control and/or synchronize one or more digital test resources 230 which, for example, provide digital stimulus signals for testing the device under test and/or evaluate digital response signals from the device under test.

However, it should be noted that the parametric test resources/analog test resources 220 and the digital test resources 230 may also be coupled to the device under test interface 216 using a variable allocation, such that the parametric test resources/analog test resources and/or the digital test resources can be coupled with different pins of the device under test interface 216 in a variable manner.

However, the on-chip system test controller 210 may be configured to control and/or synchronize the parametric test resources/analog test resources 220 and/or the digital test resources 230 using one or more "local" communication interfaces, which are not shared with other on-chip system test controllers that may be present in the automated test equipment. Accordingly, the on-chip system test controller may comprise a very good real time-capability when controlling and/or synchronizing the parametric test resources/analog test resources 220 and/or the digital test resources 230.

Moreover, it should be noted that the automated test equipment may provide for a synchronization of the on-chip system test controller of the device under test and of the additional test resources 220, 230. For example, another component of the automated test equipment may provide synchronization signals to the on-chip system test controller, the device under test and the other test resources 220, 230. Accordingly, a high degree of synchronization can be achieved.

Figure 3:
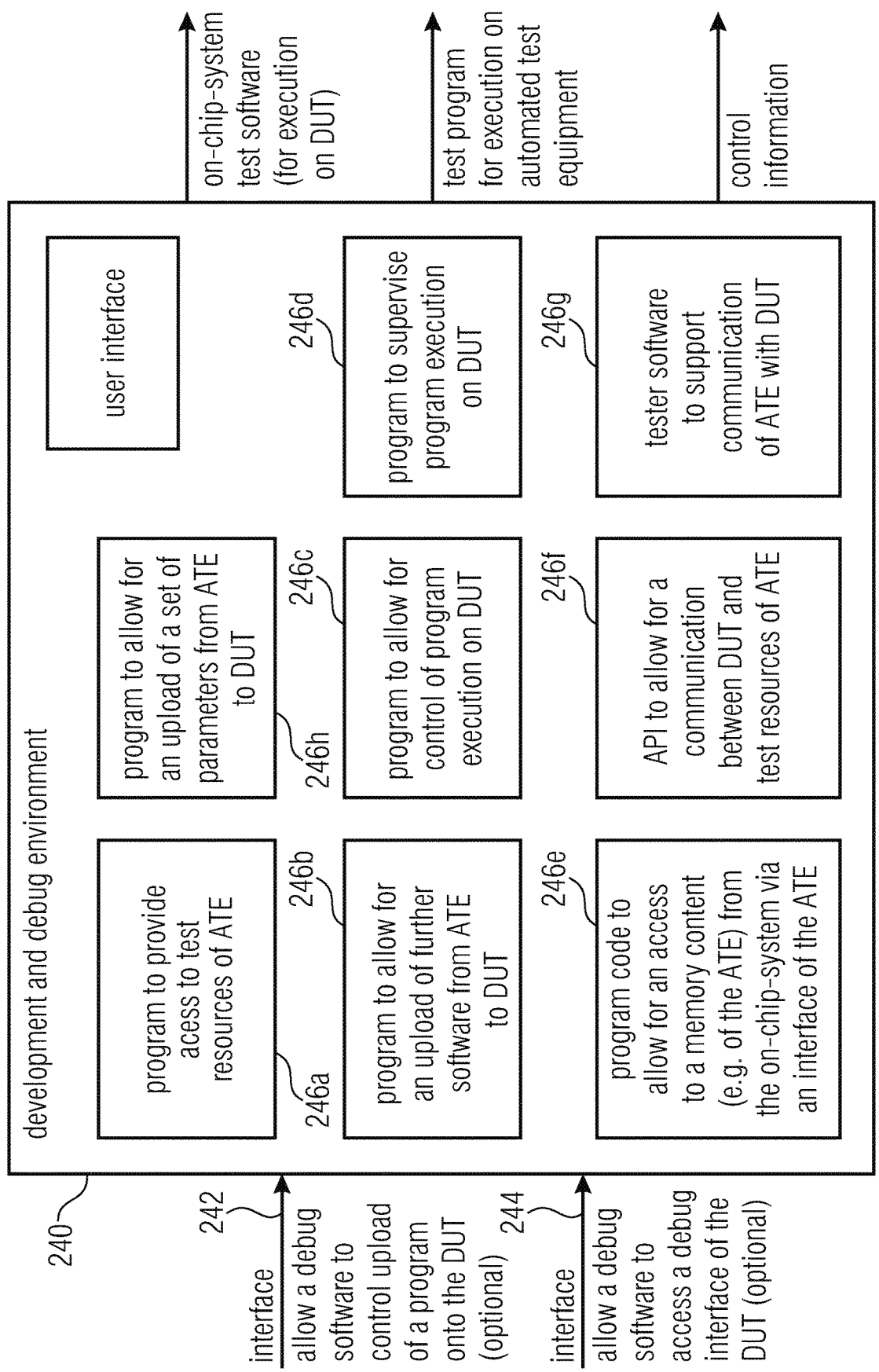
FIG. 3 shows a schematic representation of a development and debug environment for usage in the automated test equipment according to FIG. 2.

In the following, the development and debug environment 240, which may optionally be included in the automated test equipment 200, will be described taking reference to FIG. 3.

The development and debug environment 240 may, for example, be adapted to provide both on-chip system test software for execution on the DUT which may, for example, be stored in the software repository 260, and a test program for execution on the automated test equipment (for example, for execution in the software stack 258). However, the development and debug environment may also provide control information, which may be considered by the on-chip system test controller 210.

The development and debug environment 240 may, for example, comprise a user interface to allow a software engineer to develop on-chip system test software and/or test programs. In addition, the development and debug environment may optionally comprise an interface 242, which is adapted to allow a debug software to control an upload of a program onto the device under test. Thus, the development and debug environment 240 may cooperate with a third party debug software, to allow for an efficient debugging of an on-chip system test software. Moreover, the development and debug environment 240 also comprises an interface 244 to allow a debug software to access a debug interface of the DUT. For example, the access to the debug interface of the DUT may be via the on-chip system test controller, which has direct access to the debug interface 252.

Moreover, the development and debug environment may support a software engineer in the development of both on-chip system test software to be executed on the device under test and in the development of a test program for execution on the automated test equipment.

For this purpose, the development and debug environment may comprise program code to provide access to test resources of the ATE. For example, said program code 246a may allow a device under test to access test resources of the ATE via the on-chip system test controller, such that, for example, the device under test can change characteristics of the test resources 220 and/or 230 using a function call to the program 246a, which may be included into the on-chip system test software by the development and debug environment at the request of a software engineer.

Moreover, the development and debug environment may also comprise a program 246b to allow for an upload of further software from the automated test equipment to the device under test. For example, said program 246b may configure a high bandwidth interface of the device under test to receive a program code to be executed on the device under test. This program 246b may be included into the on-chip system test software at the request of a software engineer. Correspondingly, the development and debug environment may include into the test program for execution on the automated test equipment (for example, on the on-chip system test controller) a program that allows for an upload of further software from the automated test equipment (e.g., from the software repository of the on-chip system test controller) to the device under test. Accordingly, the development and debug environment may include mating program code for inclusion into the on-chip system test software and into the test program for execution on the automated test equipment.

Moreover, the development and debug environment comprises a program 246c to allow for control of a program execution on the device under test. For example, said program 246c may be included into the on-chip system test software at the request of a software engineer. The program 246c may, for example, be adapted to receive program control commands from the on-chip system test controller via one of the interfaces of the device under test. However, the on-chip system test software may, for example, include a corresponding program into the test program for execution on the automated test equipment. Accordingly, it is possible to control the execution of a program on the device under test from the side of the on-chip system test controller, wherein there are "mating" program modules included in the on-chip system test software and into the test program for execution on the automated test equipment at the request of the software engineer.

Moreover, the development and debug environment comprises a program 246d which is adapted to supervise program execution on the device under test. For example, said program 246d may be included into the on-chip system test software at the request of a software engineer. The program 246d may, for example, supervise whether the on-chip system test software is properly executed or whether the on-chip system test software is in a failure state. Accordingly, the program 246d may inform the on-chip system test controller if the software running on the device under test is in a failure state, and the on-chip system test controller may react accordingly (for example, by classifying a device as failing, or by resetting the device under test, or by uploading or starting a new on-chip system test software on the device under test).

The development and debug environment also comprises a program 246e to allow for an access to a memory content (e.g., of the ATE) from the on-chip system via an interface of the automated test equipment. This program may be included into the on-chip system test software at the request of a software engineer. Accordingly, the device under test can read data from a memory of the automated test equipment (e.g., from a memory of the on-chip system test controller) by calling said program code 246e. Alternatively or in addition, the device under test may write data to the memory of the automated test equipment (e.g., of the on-chip system test controller) by calling the program code 246e. Moreover, the development and debug environment may also provide a program or configuration information for the on-chip system test controller, to support this access of the device under test to the memory of the automated test equipment, wherein it may be ensured that the program code included into the on-chip system test software (for execution on the dut) and the configuration information of the on-chip system test controller match.

The development and debug environment may also comprise an application programming interface 246f, which allows for a communication between the device under test and test resources (e.g., test resources 220, 230) of the automated test equipment. Accordingly, by using this application program interface 246f at the request of the software engineer, the device under test can be enabled to control test resources of the automated test equipment.

Moreover, the development and debug environment also comprises tester software 246g to support communication of the automated test equipment with the device under test. This tester software 246g may, for example, be included into the test program for execution on the automated test equipment at the request of a software engineer, and support communication between the automated test equipment and the device under test.

Moreover, the development and debug environment also comprises a program 246h to allow for an upload of a set of parameters from the ATE to a DUT. Accordingly, it is possible to update parameters for an execution of an on-chip-system test (e.g. uploaded using program 246b) and started by program 246c), e.g. between subsequent executions of the on-chip-system test, to thereby overcome the need for multiple upload of similar on-chip-system tests which only differ by a number of parameters.

To conclude, the development and debug environment 240 may comprise a number of software blocks 246a to 246h which support the development of on-chip system test software and also of a test program for execution on the automated test equipment. For example, mating software components may be automatically introduced by the development and debug environment both into the on-chip system test software and into the test program for execution on the automated test equipment, wherein, for example, parameter sets of the components may also be automatically adjusted by the development and debug environment to appropriate values.

However, it should be noted that the development and debug environment does not necessarily need to comprise all of the software portions 246a to 246g described herein. Rather, in some cases it is sufficient that the development and debug environment 240 comprises one or more of said software portions.

According to another aspect, it is possible to load test parameters onto the DUT independent of loading the on-chip-system test itself (e.g. to upload a parameter set to the device under test). For example, an on-chip-system test (OCST) may stay loaded, but prior to its next execution, the parameters may be changed. This is more efficient and typically done when characterizing an OCST.

Moreover, it should be noted that the automated test equipment 200 described herein may optionally be supplemented by any of the features, functionalities and details disclosed in this document, both individually and taken in combination.

3. On-Chip System Tests According to FIG. 6

Figure 6:
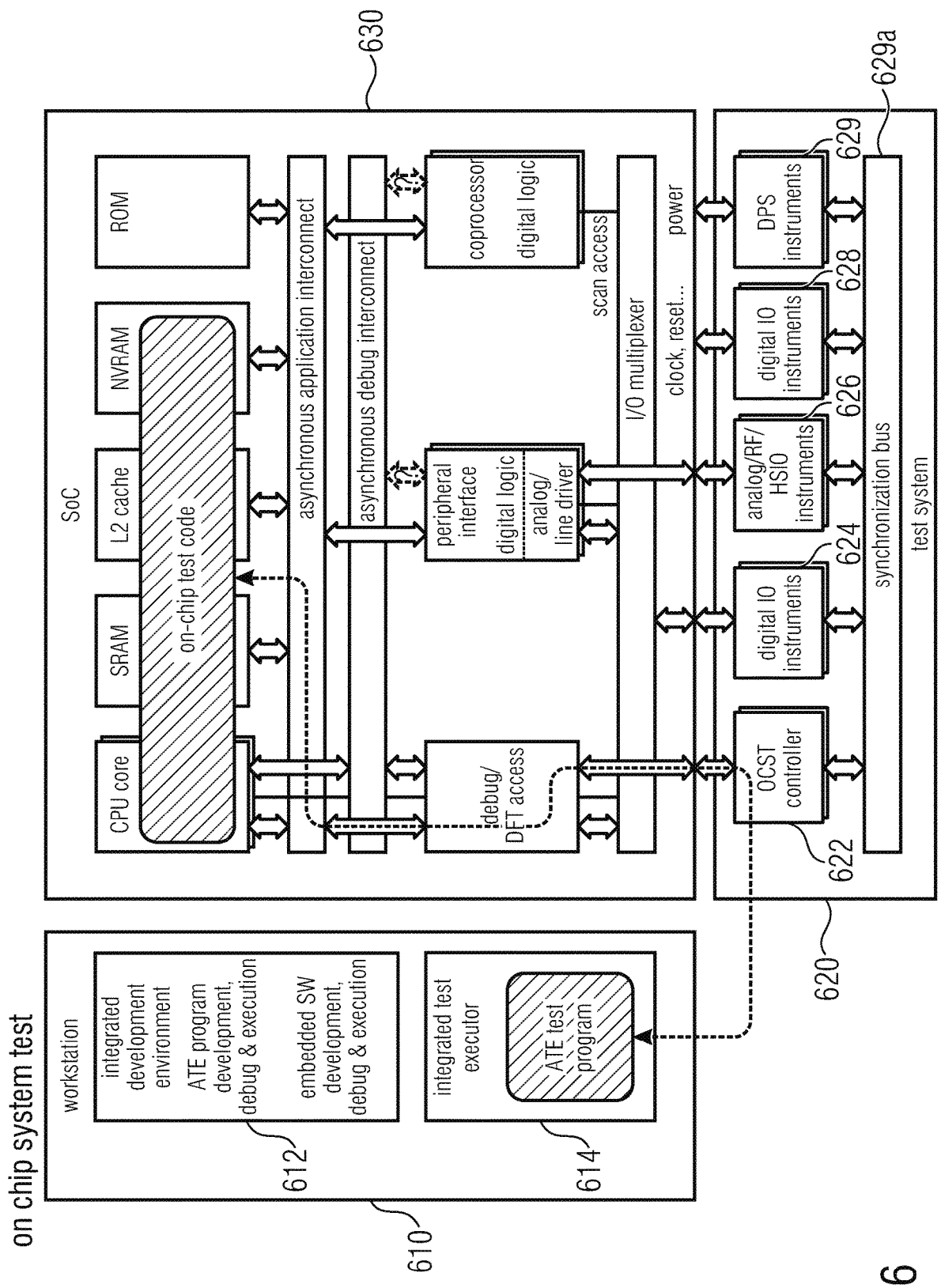
FIG. 6 shows a schematic representation of an on-chip system test.

FIG. 6 shows a schematic representation of an on-chip system test, according to an embodiment of the invention.

Figure 4:
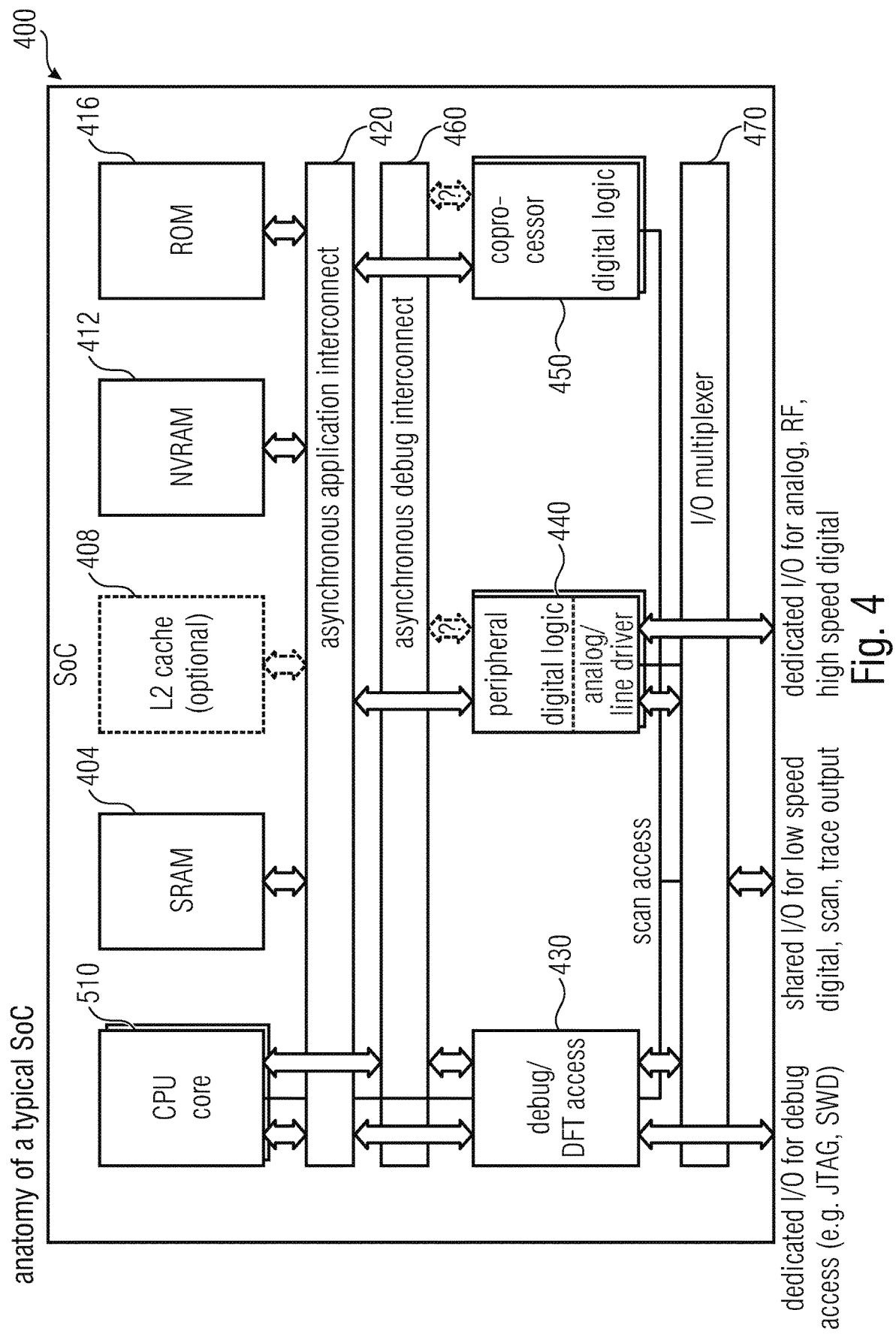
FIG. 4 shows a block schematic diagram of a system on a chip, which can be tested using the automated test equipment disclosed herein.
Figure 5:
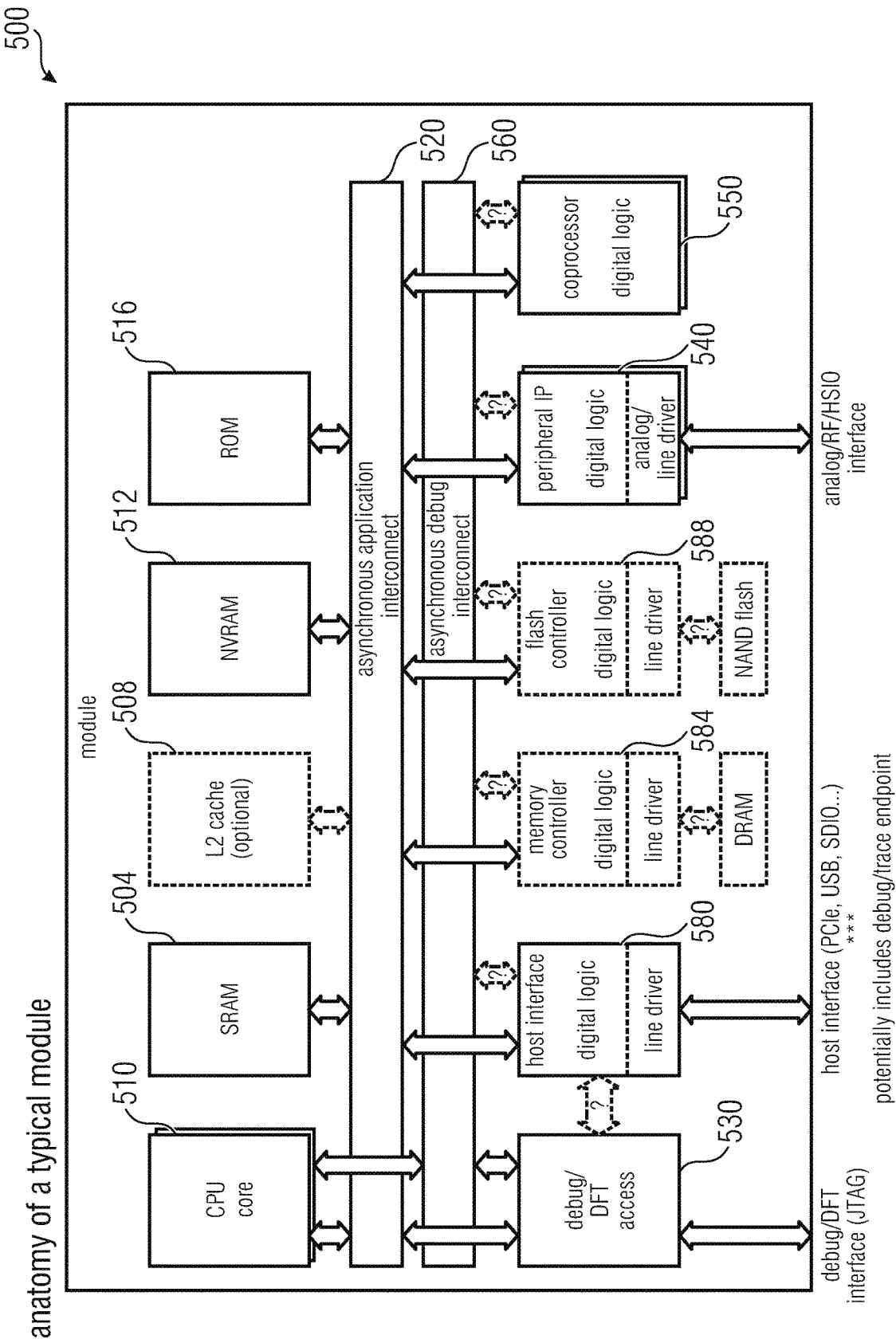
FIG. 5 shows a block schematic diagram of a module, which can be tested using the automated test equipment described herein.

The on-chip system test according to FIG. 6 is based on three main components, a work station 610, a test system 620 and a SoC 630. For example, the SoC 630 may correspond to the SoC 400 shown in FIG. 4, such that reference is made to the above explanations.

The workstation 610, which may be part of the automated test equipment, comprises, for example, an integrated development environment 612 and an integrated test executor 614.

For example, the integrated development environment 612 may comprise an automated test equipment program development, debug and execution and may also comprise an embedded software development, debug and execution. For example, the integrated development environment 612 may comprise the functionality of the development and debug environment 240. However, it should be noted that it is an important difference to conventional development environments that the indicated development environment 612 allows for a development, debug and execution of embedded software, i.e., of software running on the device under test 630.

Moreover, the integrated test executer 614 may, for example, comprise an ATE test program, and may cooperate with the test system 620. For example, the integrated executer may execute an ATE test program, wherein said ATE test program may control the functionality of the test system 620 and may receive data (e.g., test result information) from the test system 620.

The test system 620, which is typically also part of the automated test equipment, comprises one or more on-chip system test controllers 622, which may, for example, correspond to the on-chip system test controller 110 or to the on-chip system test controller 210.

The test system 620 also comprises one or more digital input/output instruments 624, which may, for example, correspond to the digital test resources 230 described before.

Moreover, the test system 620 also comprises one or more analog/radio frequency (RF)/high speed input output (HSIO) instruments 626, which may, for example, correspond to the parametric test resources 220.

The test system 620 also comprises one or more digital input/output instruments 628, which may, for example, also correspond to the digital test resources 230. Moreover, the test system 620 comprises one or more device power supply instruments 629, which may, for example, correspond to the parametric test resources 220. Moreover, the test system 620 comprises a synchronization bus 629a, wherein the one or more on-chip system test controllers 622, the one or more digital input/output instruments 624, the one or more analog/RF/HSIO instruments 626, the one or more digital input/output instruments 628 and the one or more device power supply instruments 629 are all coupled to the synchronization bus 629. Accordingly, the on-chip system test controller 622 may, for example, synchronize the instruments 624, 626, 628, 629, which may, for example, take over the role of the parametric test resources 220 and of the digital test resources 230 described above.

For example, the digital input/output instrument 624 may be coupled to the input/output multiplexer of the SoC 630 and may provide one or more digital signals to the SoC and/or receive one or more digital signals from the SoC 630. The analog/radio frequency/HSIO instruments 626 may, for example, be coupled to one or more peripheral interfaces of the SoC.

The one or more digital input/output instruments 628 may, for example, provide auxiliary signals, like a clock signal, a reset signal, and the like for the SoC, and may therefore also help to control the test procedure. The one or more device power supplies 629 may provide one or more supply voltages for the SoC, and may, for example, also be used to vary the test environment of the SoC, in order to test the SoC for different supply voltages under the control of the on-chip system test controller 622.

The integrated test executer 614 may, for example, control an overall test flow performed by the automatic test equipment and may, for example, configure the on-chip system test controller 622 to perform a certain test flow. For example, the integrated test executer 614 may initialize the on-chip system test controller, wherein the on-chip system test controller subsequently performs and controls the test process autonomously. However, the integrated test executer 614 may also execute some control over the test execution performed by the on-chip system test controller.

For example, the integrated test executer 614 may instruct the on-chip system test controller to upload an on-chip system test software to the device under test 630, for example, via a debug interface of the SoC. Accordingly, an on-chip system test code (also designated with on-chip system test program or, briefly, on-chip system test) may be executed on the device under test 630, wherein the execution may be performed by the CPU core of the SoC, making use of the memories of the SoC (for example, making use of the SRAM, the L2 Cache and the NVRAM).

The on-chip test code, which is executed by the SoC may, for example, be developed and debugged in the integrated development environment 612, and may be uploaded to the SoC under the control of the integrated test executer via the OCST controller 622 and the debug interface of the SoC.

To conclude, the automated test equipment described herein may perform a test of a SoC (or, generally speaking, of a device under test), wherein the OCST controller takes over an important part in the control of the testing and may be responsible for a synchronization of one or more instruments. The OCST controller may also upload an on-chip system test software onto the device under test, where a development of said on-chip system test software ("embedded software") is, for example, performed using the workstation 610 which is part of the automated test equipment. An overall test flow may be controlled by an ATE test program which is also executed by the workstation 610 using an integrated test executor 614.

Having an OCST controller 622, which is responsible for the direct communication with the device under test and also (optionally) for the synchronization of a plurality of instruments, communication bottlenecks can be avoided and a high throughput can be achieved, which is desirable for many modern devices under test that use high bandwidth interfaces.

However, it should be noted that the on-chip system test shown in FIG. 6 may optionally be supplemented by any of the features, functionalities and details disclosed herein, both individually and taken in combination.

4. On-Chip System Test Core Concepts

In the following, some on-chip system test core concepts will be described, which may optionally be implemented in any of the automated test equipment described herein.

According to a first aspect, it is possible to include an embedded software development, debug and deployment environment into an existing ATE test controller software.

In accordance with a second aspect, it is desirable to provide a run time and API for test program fragments running on the Dut's CPU(s).

According to a third aspect, it is desirable to provide facilities for synchronization and data transfer between the main test program fragments and the main ATE test program controlling the ATE instruments.

According to a fourth aspect, it is desirable to make this easy to use for average test engineers (or software engineers). For example, it is desirable to make it easy for them to get the required DUT specific software from their validation or software/firmware development group.

According to a fifth aspect, it is desirable to enable the environment to run on limited resources (e.g., missing memory in wafer sort).

According to a sixth aspect, it is desirable to provide ready to use test program fragments for common test challenges on widely used infrastructure (e.g., AMBA bus stress test).

To conclude, any of the above mentioned aspects may optionally be introduced into the automated test equipment described herein, both individually and taken in combination.

5. Applications

In the following, some applications will be described taking reference to FIGS. 7 to 11.

Figure 7:
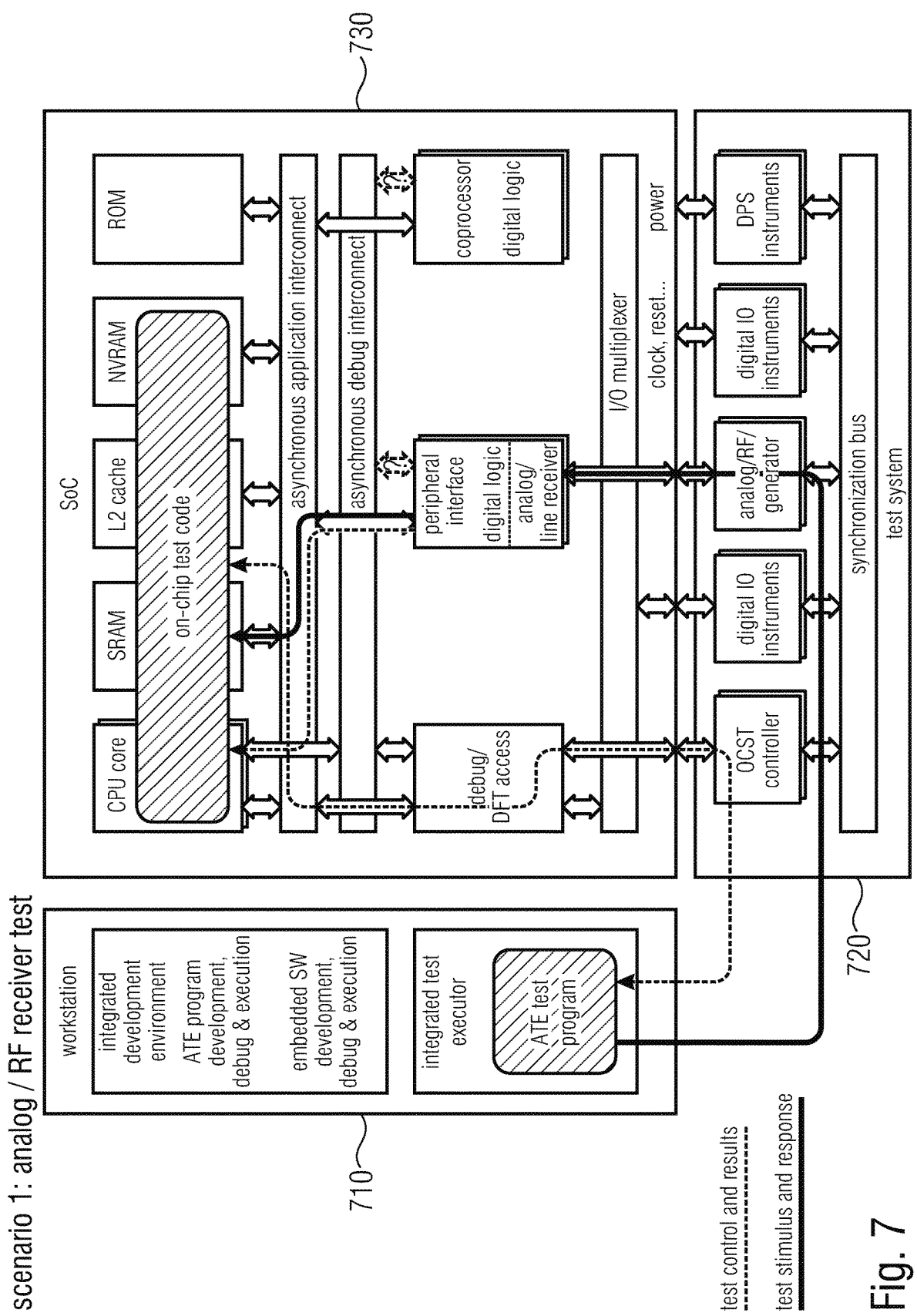
FIG. 7 shows a schematic representation of a first scenario, in which an analog test and/or a RF receiver test is performed.

FIG. 7 shows a schematic representation of a first scenario, in which an analog/RF receiver test is performed. In this case, an automated test equipment is used, which comprises a workstation 710 that may, for example, correspond to the workstation 610 and which also comprises a test system 720, which may, for example, correspond to the test system 620. Moreover, the device under test 730 may correspond, for example, to the device under test 630.

As can be seen, the automated test equipment program, which is performed, for example, by the integrated test executor, instructs the on-chip system test controller to upload an on-chip system test code onto the device under test which allows for an analog/RF receiver test. For example, said on-chip system test code, which is executed on the device under test, may configure the peripheral interface of the device under test 730 for a reception of analog signals or radio frequency signals.

Moreover, the integrated test executor may control an analog/radio frequency generator of the test system 720 to provide an analog signal or a radio frequency signal to the peripheral interface of the device under test 730. For example, the integrated test executor and the workstation 710 may directly control the analog/radio frequency generator. However, in a preferred embodiment, the on-chip system test controller actually controls and synchronizes the analog/radio frequency generator of the test system. Consequently, the peripheral interface of the device under test typically generates digital information that reflects the received analog signal or radio frequency signal (received by the peripheral interface) and the on-chip test code may, for example, evaluate the digital data provided by the peripheral interface and/or forward the digital data received from the peripheral interface to the test system for evaluation (for example, by the OCST controller). Accordingly, test results may be provided to the integrated test executor by the OCST controller, which allows to judge the device under test, for example, as okay or as failing.

To conclude, an analog/RF receiver test of the device under test may be performed, which may be supported by an on-chip test code, which is executed on the device under test and which can also be supported by the OCST controller, which may, for example, upload the on-chip test code to the device under test, control the analog/radio frequency generator and also handle an obtention of result information from the device under test and a forwarding of result information to the workstation 710.

Figure 8:
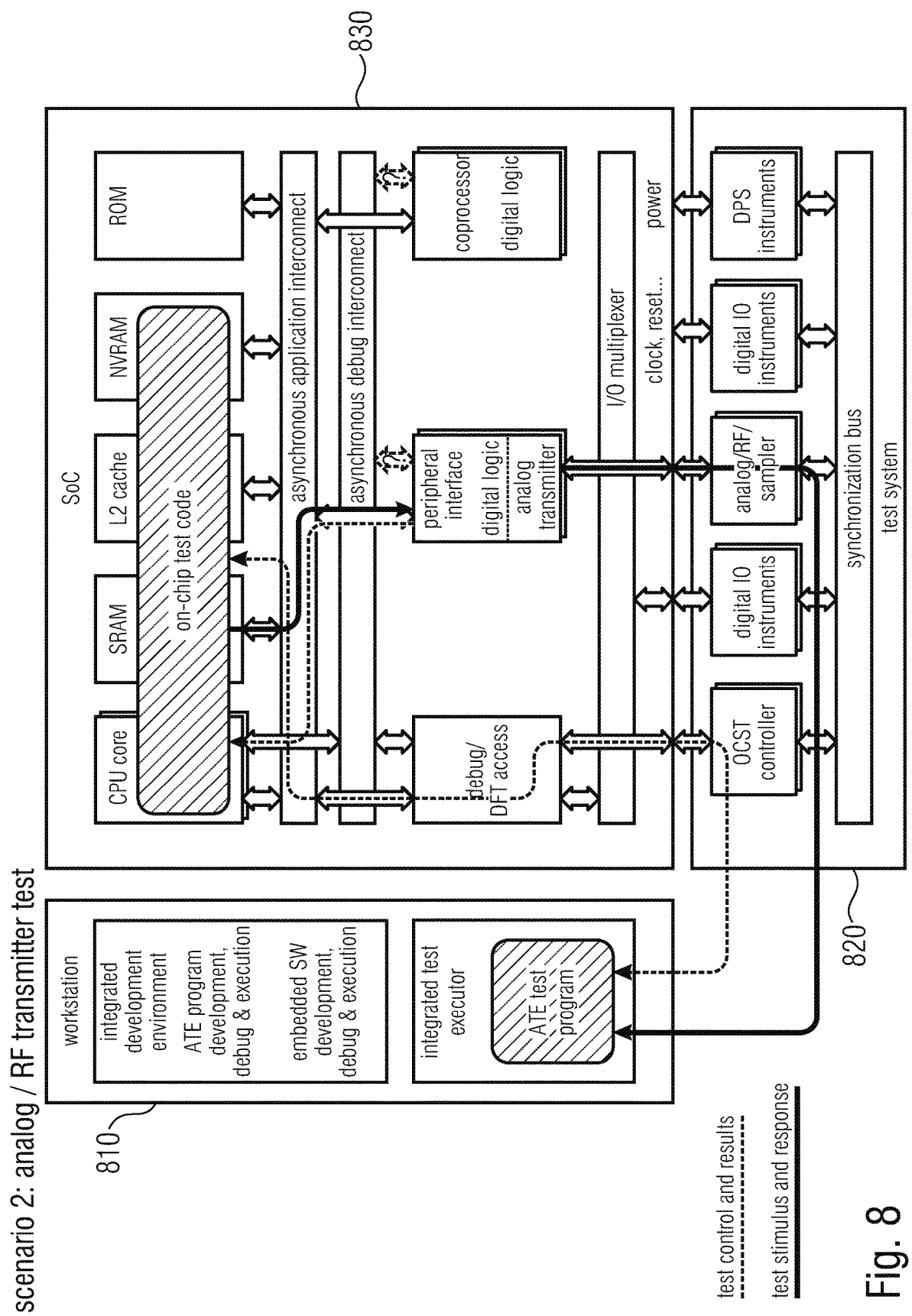
FIG. 8 shows a schematic representation of a second scenario in which an analog test and/or a RF transmitter test is performed.

FIG. 8 shows a schematic representation of a second scenario in which an analog/radio frequency transmitter test is performed.

In the second scenario, there is a workstation 810, which may correspond to the workstation 610 or to the workstation 710, a test system 820, which may correspond to the test system 720 or to the test system 620, and there is a device under test 830, which may correspond to the device under test 730 or the device under test 630. In particular, it should be noted that the second scenario is very similar to the first scenario.

However, in the second scenario, an on-chip test code is uploaded to the device under test 830 (e.g., via the OCST controller), which causes the device under test 830 to transmit an analog signal or a radio frequency signal via a peripheral interface. For example, data to be transmitted via the peripheral interface of the device under test 830 are provided by the on-chip test code running on the device under test 830. Moreover, an analog sampler/radio frequency sampler of the test system 820 receives the analog signal or radio frequency signal generated by the device under test 830. Information about the analog signal or radio frequency signal received by the test system 820 from the device under test 830 may, for example, be evaluated by the OCST controller, or may be forwarded to the integrated test executor on the workstation 810, for example, by the OCST controller. Accordingly, it may be judged, for example by the OCST controller or by the integrated test executor running on the workstation 810, whether the analog signal provided by the device under test fulfils the expectations or requirements. Accordingly, it can be decided whether the device under test should be classified as being ok or as failing.

It should be noted here that there is a cooperation between the automated test equipment (comprising the workstation 810 and the test system 820) and the device under test 830. On-chip test code (or on-chip system test software) uploaded to the device under test 830 controls the provision of the analog signal or radio frequency signal, and the test system receives and evaluates the analog signal, preferably under the control of the OCST controller, which typically has a fast and direct interface to the analog/radio frequency sampler. Since the OCST controller is typically also able to communicate with the device under test 830 in a very direct manner, the OCST controller may also have some degree of control over the analog signal provided by the device under test and over the timing when the analog signal is provided.

To conclude, the automated test equipment disclosed herein may optionally be adapted to handle the second scenario.

Figure 9:
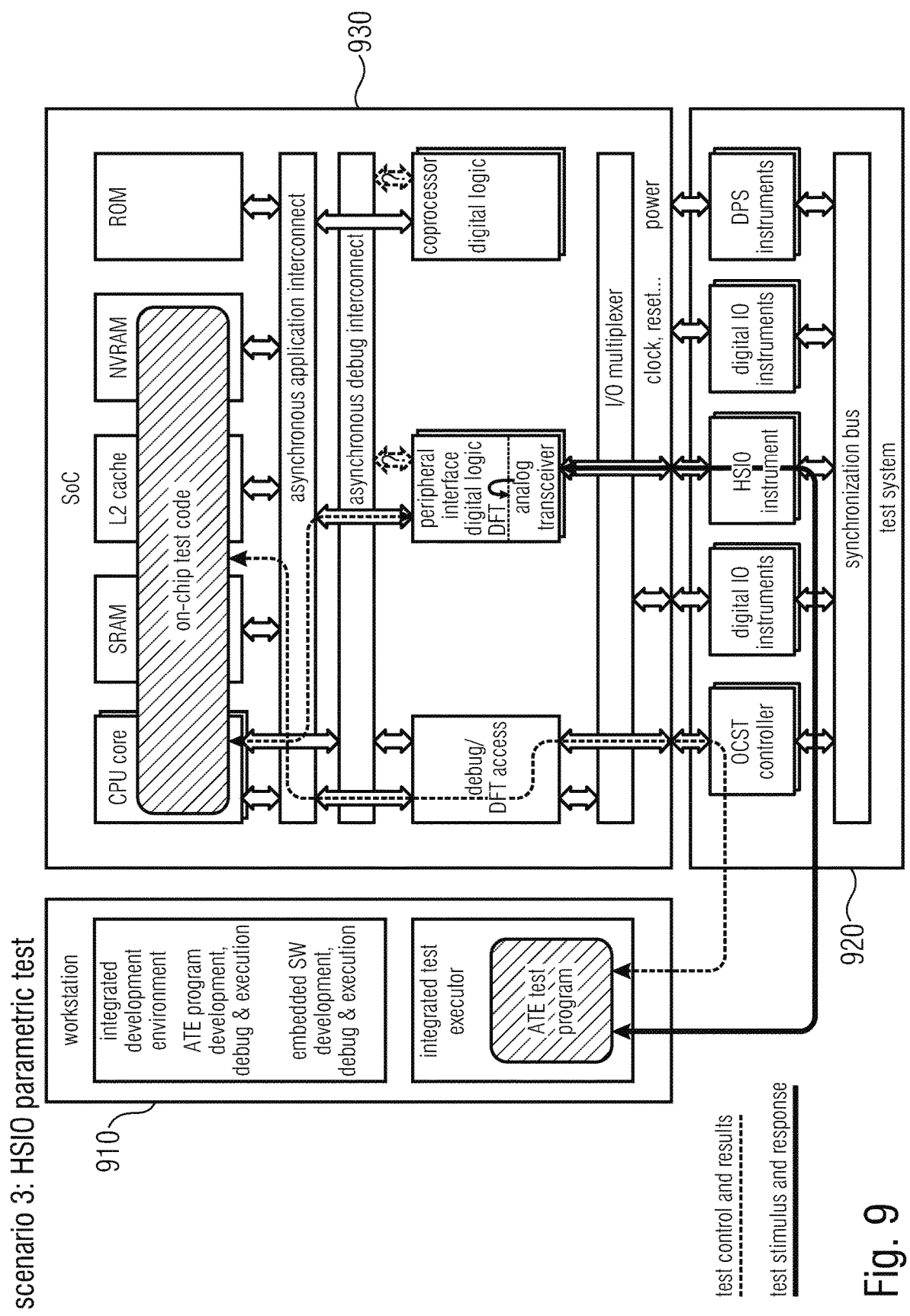
FIG. 9 shows a schematic representation of a third scenario in which a high speed input output (HSIO) parametric test is performed.

FIG. 9 shows a schematic representation of a third scenario in which a high speed input output (HSIO) parametric test is performed. In the third scenario, a workstation 910 and a test system 920 are used to test a device under test 930, wherein the workstation 910 may correspond to the workstations 610, 710, 810 described before, and wherein the test system 920 may correspond to the test systems 620, 720, 820 described before.

However, in the third scenario, a high speed input output instrument of the test system 920 may be used to transmit data to the device under test and to receive data from the device under test. For example, the high speed input output instrument of the test system 920 may be coupled to a peripheral interface (e.g., a HSIO peripheral interface) of the device under test. For example, the test system may provide data to the device under test 930 via the HSIO interface of the test system 920, wherein the data may be determined by the ATE test program running on the integrated test executor. For example, the control over the transmission of data to the device under test via the high speed input output interface of the test system 920 may be executed by the OCST controller, which receives the data from the ATE test program running on the integrated test executor.

The peripheral interface of the DUT 930 may, for example, loop back the data provided by the test system, for example, by an appropriate configuration of the peripheral interface (e.g., exploiting some design for test of the peripheral interface). However, the loop back functionality may also be provided by the on-chip test code, which may read the received data from the peripheral interface and copy the read data back to an output buffer of the peripheral interface.

The test system 920 may receive the data transmitted by the peripheral interface of the device under test 930, and the received data may be evaluated by the OCST controller and/or forwarded to the ATE test program which runs on the integrated test executor.

Accordingly, the high speed input output interface of the device under test 930 may be tested, wherein parameters of the transmission may be adjusted by the high speed input output instrument of the test system 920, for example, under the control of the OCST controller, such that parameters of the high speed input output interface of the device under test 930 can be determined. Moreover, a particularly high efficiency is achieved, for example, if the OCST controller controls the transmission of data to the peripheral interface of the device under test and also the reception of data from the peripheral interface and, furthermore, the configuration of the device under test. Accordingly, the high speed input output parametric test can be performed in a very efficient manner.

Figure 10:
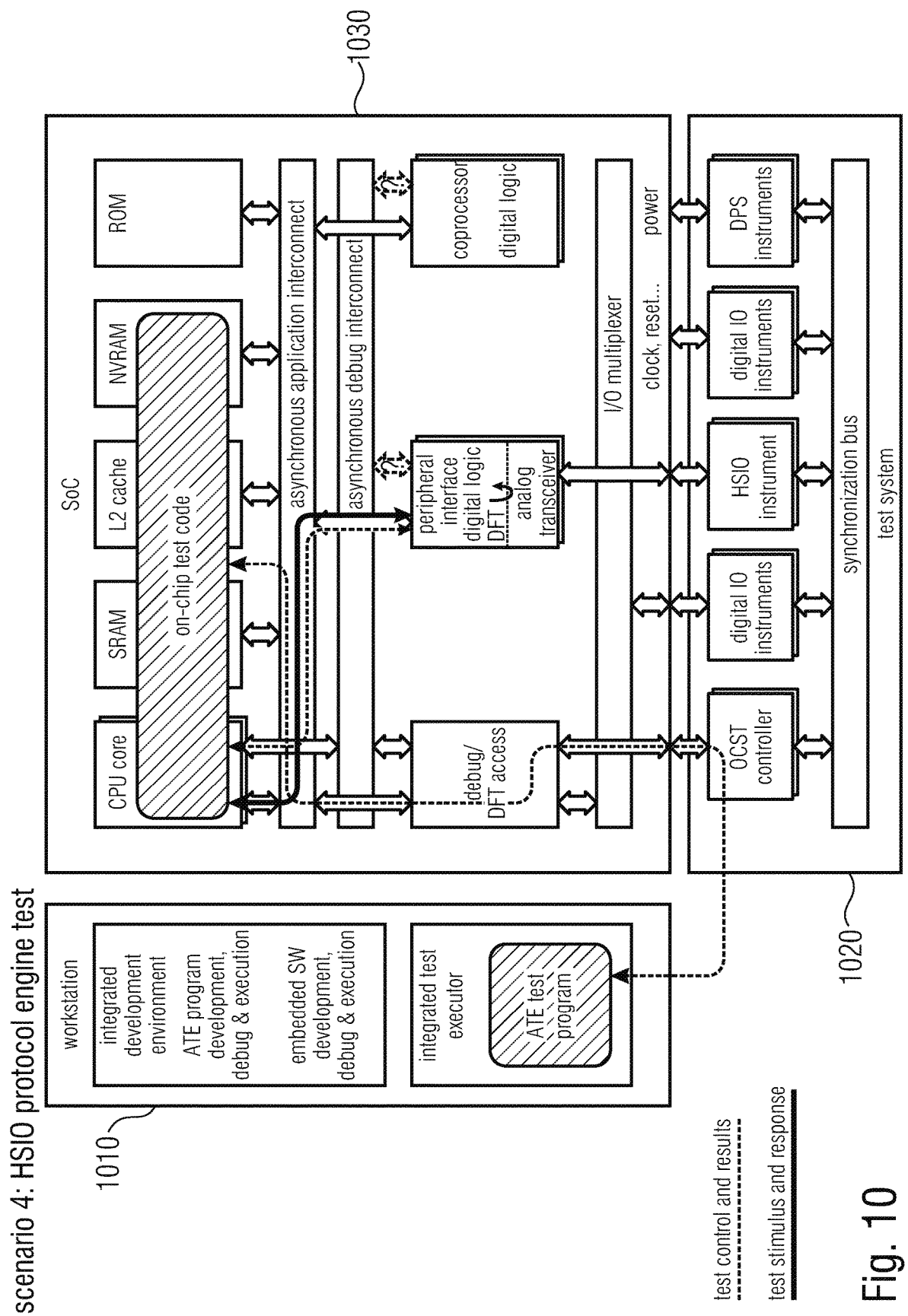
FIG. 10 shows a schematic representation of a fourth scenario in which a high speed input output (HSIO) protocol engine test is performed.

FIG. 10 shows a schematic representation of a fourth scenario, in which a HSIO protocol engine test is performed. In the fourth scenario, a workstation 1010 and a test system 1020 are used to test a device under test 1030, wherein the workstation 1010 may correspond to the workstations 610, 710, 810, 910, wherein the test system 1020 may correspond to the test systems 620, 720, 820, 920 and wherein the device under test 1030 may correspond to the devices under test 630, 730, 830, 930.

In the fourth scenario, a peripheral interface of the device under test 1030 may be configured to be in a loop back mode, which may, for example, be achieved using a design-for-test circuitry. Accordingly, the automated test equipment may upload an on-chip test code onto the device under test 1030 which configures the peripheral interface to be in the look back mode and which sends data to the peripheral interface and which receives and evaluates data looped back by the peripheral interface. For example, the on-chip test code, which is executed on the device under test, may even evaluate whether the data looped back from the peripheral interface is in accordance with expected data. Accordingly, the protocol engine of the high speed input output interface can be tested. In particular, the on-chip test code may also evaluate protocol information provided by the peripheral interface.

To conclude, in the fourth scenario, the on-chip system test controller may, for example, only be responsible for uploading an appropriate on-chip test code to the device under test 1030 and for receiving a result information from the device under test and for forwarding the result information to the workstation (for example, to the integrated test executor). Accordingly, a high speed input output protocol engine test can be performed with high efficiency.

Figure 11:
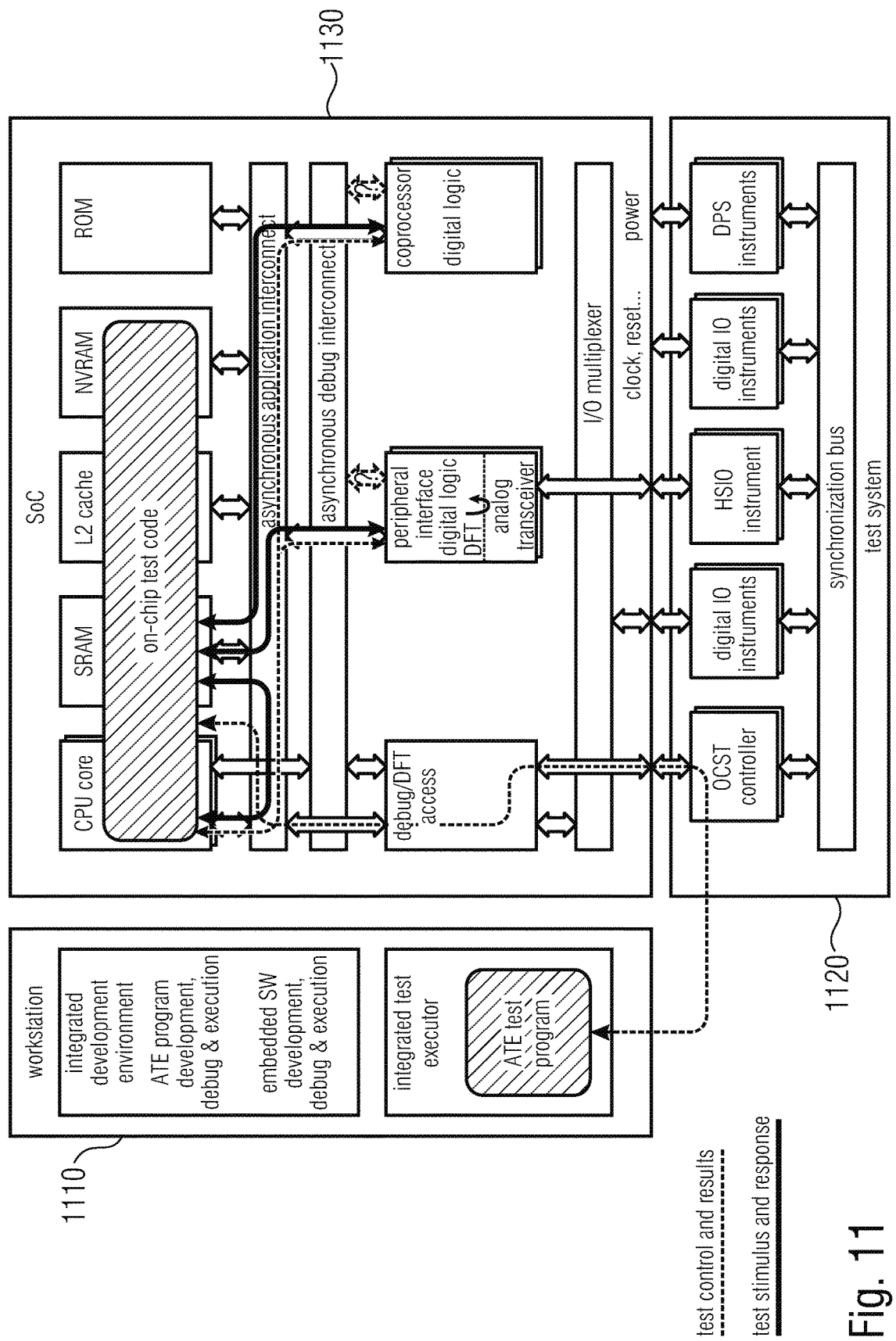
FIG. 11 shows a schematic representation of a fifth scenario in which an interconnect stress test is performed.

FIG. 11 shows a schematic representation of a fifth scenario, in which an interconnect stress test is performed. In the fifth scenario, a work station 1110 and a test system 1120 are used to test a device under test 1130. For example, the automated test equipment comprising the workstation 1110 and the test system 1120 is configured to upload an on-chip test code to the device under test which is configured to perform data transfer between different blocks of the device under test, to thereby "stress" the asynchronous application interconnect. For example, data transfer may be between the CPU core and the SRAM, between a peripheral block of the device under test and the SRAM and between a co-processor of the device under test and the SRAM. For example, the on-chip test code may be configured to initiate such "stressful" data traffic via the asynchronous application interconnect and may also monitor an integrity of the data transfer. Accordingly, the OCST controller of the test system 1120 may obtain a result information from the device under test 1130, for example, via the debug interface and may, for example, forward the result information to the automated test equipment test program, which runs on the integrated test executor. Accordingly, the interconnect of the device under test 1130 may be tested efficiently, wherein the load of the test system is comparatively small.

6. Operation Modes of the Device Under Test (SoC)

In the following, different modes for operating the device under test will be described. Also, some details regarding a boot process and optional details regarding the automated test equipment will be discussed.

OCST with an Operating System Environment

Figure 12:
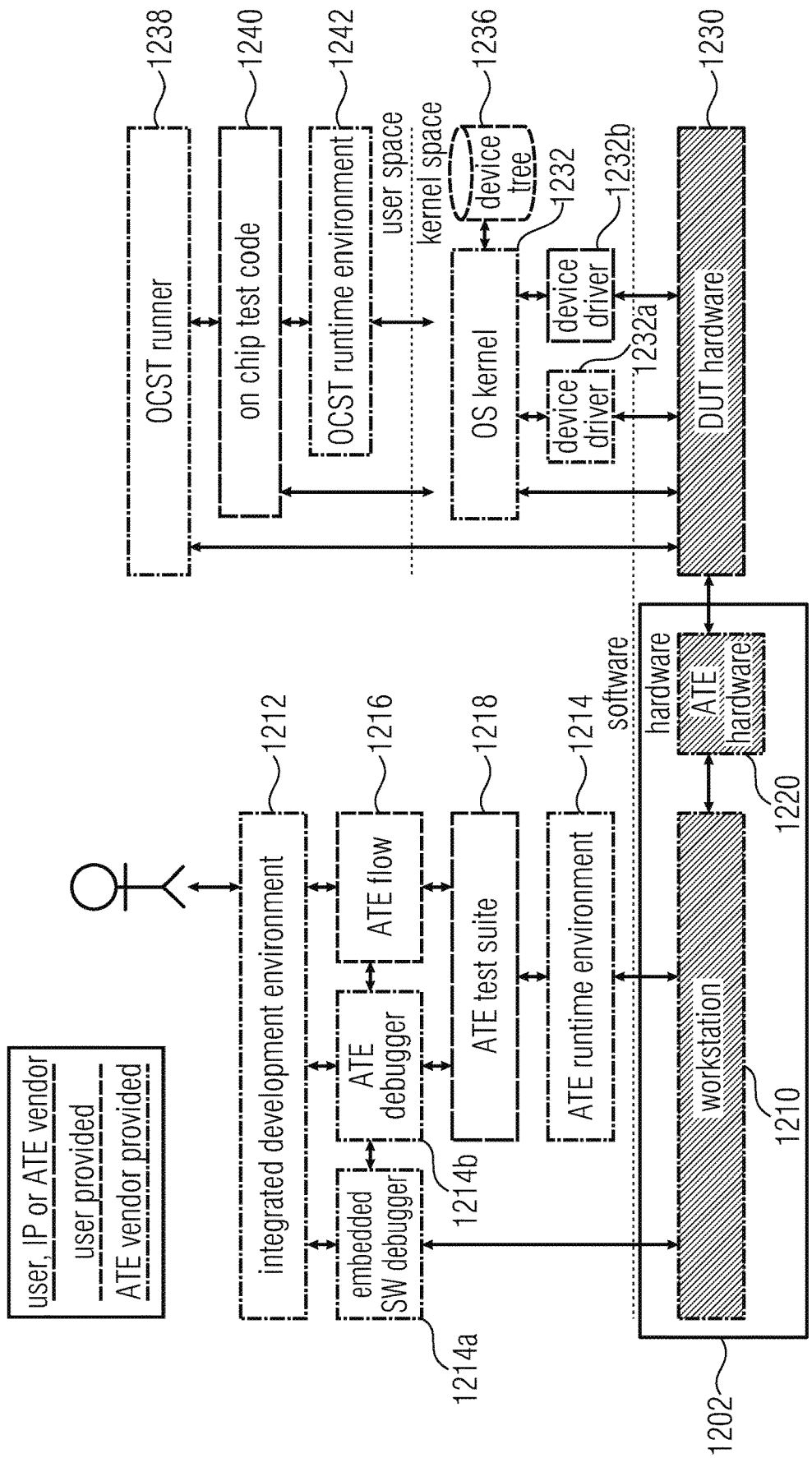
FIG. 12 shows a schematic representation of an on-chip system test (OCST) with an operating system environment.

In the following, it will be described how an on-chip system test can be performed with an operating system environment. FIG. 12 shows a schematic representation of such an on-chip system test with an operating system environment.

As can be seen in FIG. 12, the automated test equipment may, for example, comprise a workstation 1210 and an automated test equipment hardware 1220. For example, the workstation 1210 may correspond to the workstations 610, 710, 810, 910, 1010, 1110 described above, and the automated test equipment hardware may, for example, correspond to the test systems 620, 720, 820, 920, 1020, 1120. However, the automated test equipment 1202 may, for example, comprise some or all of the functionalities of the automated test equipment disclosed herein. Alternatively, however, any of the functionalities described here with respect to the automated test equipment may optionally be taken over into any of the other automated test equipment disclosed herein, both individually and taken in combination.

It should be noted that the workstation 1210 typically runs a number of software modules. For example, the workstation may be configured to run an integrated development environment 1212 which may, for example, correspond to the development and debug environment 240 described earlier. The integrated development environment may comprise or cooperate with an embedded software debugger 1214a and an ATE debugger 1214b. For example, the embedded software debugger may be adapted to debug "embedded software", i.e., software to be executed on the device under test (also briefly designated as "on-chip system test" herein). The ATE debugger 1214b may, for example, be configured to debug automated test equipment software, like, for example, an ATE flow 1216 which may, for example, be user-provided. For example, the integrated development environment 1212 may be configured to communicate with the embedded software debugger 1214a and with the automated test equipment debugger 1214b and to edit the ATE flow 1216. Moreover, the ATE debugger 1214b may be configured to evaluate the ATE flow 1216. The embedded software debugger 1214a may, for example, communicate with the device under test via the workstation 1210 and the ATE hardware 1220. Moreover, there is also an automated test equipment test suite 1218 running on the workstation, as well as an automated test equipment run time environment 1219. For example, the automated test equipment run time environment 1219 is a software layer that is between the workstation (or the operating system of the workstation) and the ATE test suite 1218a. Moreover, it should be noted that the ATE test suite 1218 typically executes the ATE flow 1217 and cooperates with the ATE debugger 1214b.

To conclude, the integrated development environment 1212 may, for example, provide access (e.g. for a user) to the embedded software debugger 1214, to the ATE debugger 1214b and further allows to control the execution of the ATE flow.

Moreover, the device under test hardware 1230 may also run a variety of software modules. For example, there is an operating system kernel 1232, which uses one or more device drivers 1234a, 1234b to access hardware (for example, one or more interfaces) of the device under test. Moreover, the operating system kernel may access a "device tree" 1236 which may, for example, define the interfaces of the DUT hardware and possibly also additional memories coupled to the DUT hardware. Moreover, there is typically an "OCST runner" 1238 which may, for example, control the execution of an on-chip-test code 1240. The on-chip-test code 1240 may, for example, make use of an on-chip-system test runtime environment 1242, which may, for example, provide some functions. The OCST runtime environment 1242 is configured to cooperate with the operating system kernel 1232 (e.g., by calling functions of the OS kernel 1232). Moreover, it should be noted that the OCST runner 1238 may also be in direct communication with the DUT hardware, for example, to allow for a direct communication between the ATE hardware and the OCST runner 1238. Moreover, it should be noted that the on-chip-test code 1240 may, for example, directly access functions of the OS kernel 1232, and may also access functions of the OCST runtime environment 1242, which, in turn, accesses functions of the OS kernel 1232. Moreover, the OS kernel 1232 may, for example, be in direct communication with the DUT hardware, in addition to accessing DUT hardware via the one or more device drivers 1232a, 1232b.

It should be noted that any of the software modules running on the device under test hardware 1230 may, for example, be provided by a development and a debug environment of the automated test equipment, as described herein. Thus, the development and the debug environment may comprise one or more programs defining the software modules 1232, 1232a, 1232b, 1238, 1244, wherein the on-chip-test code 1240 is typically based on a user input to the development and debug environment.

Embedded Operating System Boot Sequence

Figure 13:
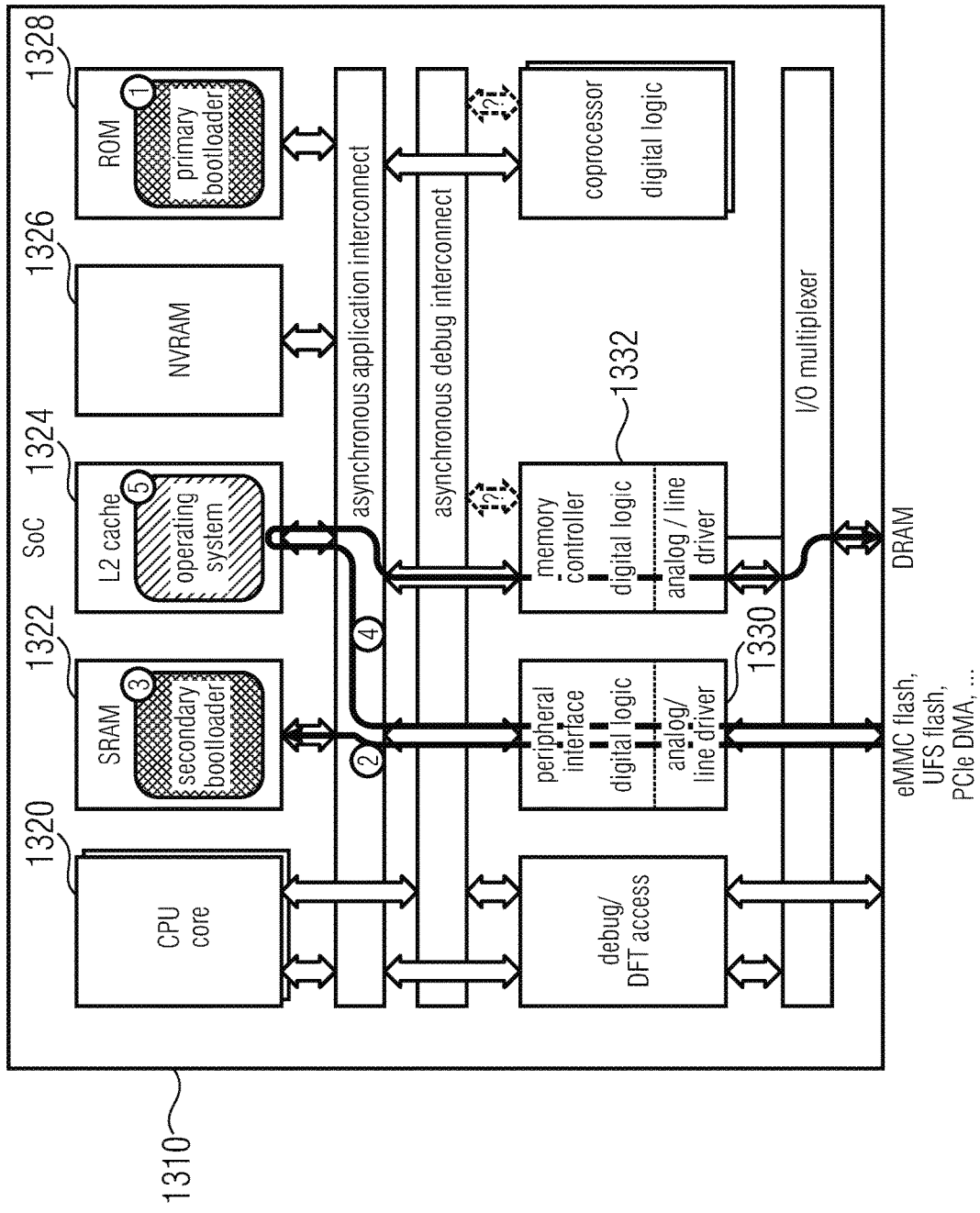
FIG. 13 shows a schematic representation of an embedded operating system boot sequence.

In the following, an example of an embedded operating system boot sequence will be described taking reference to FIG. 13, which shows a schematic representation of such an embedded operating system boot sequence. FIG. 13 shows a device under test, e.g., a SoC, 1310, which may be similar to the devices under test described before. As can be seen, the system on-a-chip 1310 comprises a CPU core 1320, a SRAM 1322, a L2 cash 1324, a NVRAM 1326 and a ROM 1328, which are all coupled to a synchronous application interconnect. Moreover, the system-on-a-chip 1310 may comprise a peripheral interface 1330 and a memory controller 1332, wherein the peripheral interface may, for example, be adapted to access different types of flash memory and/or to access a memory via a direct memory access (e.g., PCIe DMA). Moreover, the memory controller 1332 may, for example, be configured to access a dynamic random access memory DRAM.

In the boot sequence, a primary boot loader, which is stored, for example, in the ROM 1328, may cause a loading of a secondary boot loader into the SRAM 1322 via the peripheral interface 1330. Moreover, the secondary boot loader may then cause a copying of an operating system program from a flash memory or from another "external" memory to the DRAM, wherein the flash memory or the external memory is accessed via the peripheral interface 1330, and wherein the DRAM is accessed via the memory controller 1332. Accordingly, the operating system is copied to the DRAM, which is typically accessible much faster than the external memory (flash memory or memory accessible via direct memory access DMA). Subsequently, the operating system program may be executed by the CPU core 1320, wherein the L2 cash 1324 may cash portions of the operating system program in accordance with a cashing strategy. However, it should be noted that the execution of conventional operating systems typically requires the presence of a DRAM, which cannot be guaranteed in some test environments. In particular, the provision of a DRAM is difficult in some test environments.

In the following, a short discussion of an OS candidate, namely Linux on SoC, will be provided.

This OS candidate is supported on a large variety of embedded CPU cores, and is also well-documented.

The OS candidate utilizes a device tree to describe common variations of embedded CPUs. This makes it easy to adjust to a new CPU variant.

The above-mentioned OS candidate does not handle the basic system configuration (i.e., initialize the memory controller). Rather, the OS candidate relies on the boot loader to handle this.

For the above-mentioned OS candidate, there is out-of-the-box support for multiple CPU cores and for memory virtualization.

Moreover, for the above-mentioned OS candidate, there is a separation of kernel and user space.

From the user space, all hardware is accessed via a common, abstract API.

Moreover, the above-mentioned OS candidate comprises a modular hardware driver. Many drivers are readily available with the kernel code distribution. Also, customer specific drivers can be easily integrated.

Moreover, for the above-mentioned OS candidate, software debug is possible without hardware debug support (GDB).

For the above-mentioned OS candidate, debugging via JTAG/SWD requires a debugger aware of the kernels address translation and process tables (e.g., from Lauterbach).

Regarding the above-mentioned operating system candidate, it should also be noted that, with the (open source) build root environment, a stripped down Linux system, comprised of just the kernel, the necessary hardware drivers and a single user space program can be easily built. It has been found that such a system can boot in a few seconds.

To conclude, it has been found that Linux on SoC could be used as an operating system, for example, for execution on the device under test.

OCST with a Bare Metal Environment

Figure 14:
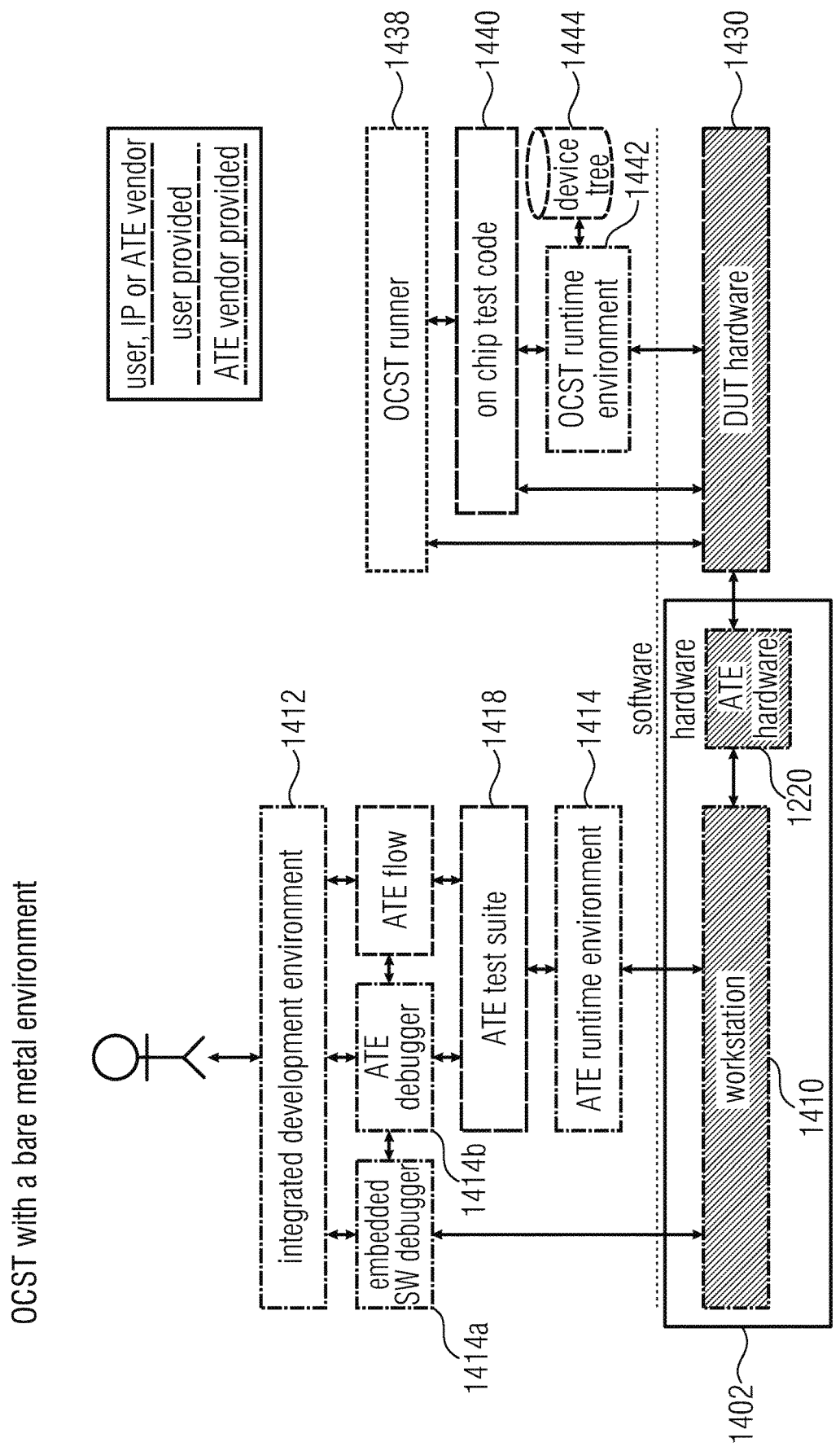
FIG. 14 shows a schematic representation of an on-chip system test with a bare metal environment.

In the following, an on-chip-system test with a bare metal environment will be described taking reference to FIG. 14, which shows a schematic representation of such an on-chip-system test with a bare metal environment.

Regarding this issue, it should be noted that the automated test equipment 1402, which comprises a work station 1410 and an automated test equipment hardware 1420 may, in principle, be identical to the automated test equipment 1202. Also, the integrated development environment 1412 may correspond to the integrated development environment 1212, the embedded software debugger 1414a may correspond to the embedded software debugger 1214a, the ATE debugger 1414b may correspond to the ATE debugger 1214b, the ATE test suite 1418 may correspond to the ATE test suite 1218, and the ATE runtime environment 1419 may correspond to the ATE runtime environment 1219. However, it should be noted that the software modules 1412, 1414a, 1414b, 1418, 1419 may be adapted to reflect that there is no operating system running on the device under test.

Regarding the device under test hardware 1430, it should be noted that no operating system kernel software is executed on the device under test hardware in this scenario. Rather, there is an OCST runtime environment 1442, which may directly access the DUT hardware 1430. The OCST runtime environment 1442 may, for example, be supported by a device tree 1444 which may, for example, define the interfaces of the DUT hardware 1430. Moreover, there is an on-chip-test code 1440, which may access functions of the OCST runtime environment 1442 and which may also access the DUT hardware 1430 directly. Moreover, there is an OCST runner 1438 which may, for example, communicate with (or control) the on-chip-test code 1440. The OCST runner 1438 may also be in direct communication with the DUT hardware 1430, and may, for example, receive control commands directly from the DUT hardware 1430 (wherein the control commands are, for example, provided by the on-chip-system test controller of the automated test equipment). Thus, the on-chip-system test runner 1438 may control the execution of on-chip-test code 1440, and the on-chip test code 1440 may use the on-chip system test runtime environment 1442 when performing a test of the DUT hardware 1430.

To conclude, an on-chip-system test may also be performed without running an operating system on the device under test, provided that the on-chip-system test runtime environment supports access to the DUT hardware.

Embedded Bare Metal Boot Via Debug Port

Figure 15:
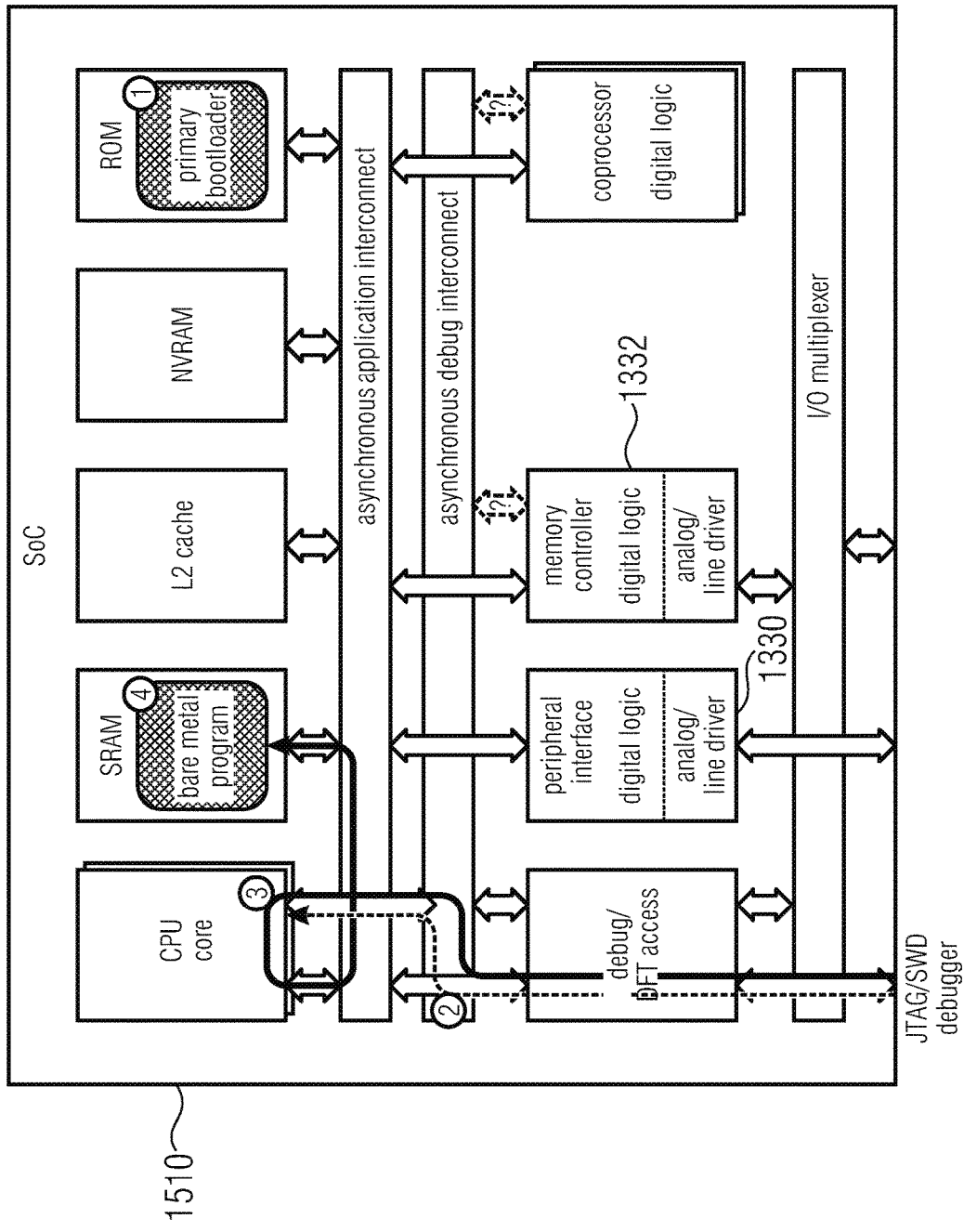
FIG. 15 shows a schematic representation of an embedded bare metal boot via debug port.

In the following, a concept for booting a device under test (SoC) which does not run an operating system ("bare metal") will be described. FIG. 15 shows a block schematic diagram of such an embedded bare metal boot via debug port.

It should be noted that the device under test 1510 may, for example, be similar to any of the other devices under test described herein.

However, the device under test 1510 comprises a primary boot loader, which is typically stored in the ROM.

However, when using a bare metal boot via the debug port, the primary boot loader is typically not used. Rather, the device is configured using the debug interface, for example, under the control of the on-chip-test system controller. For example, the on-chip-system test controller may access the CPU core via the debug interface (e.g., a JTAG interface or a SWD interface), and may configure the CPU core to copy the bare metal program into the SRAM. For example, the on-chip-system test controller may provide appropriate debug commands or scan information to cause the CPU core to copy the desired bare metal program into the SRAM. Alternatively, however, the on-chip-system test controller may also directly access the SRAM via the debug interface, if this is possible in view of the design of the device under test. When making this upload of the bare metal program, the on-chip-system test controller may, for example, stop the execution of the primary boot loader. Moreover, the on-chip-system test controller may also instruct the CPU core to execute the bare metal program which has been stored into the SRAM, for example, by setting a program counter of the CPU core to an appropriate memory address of the SRAM via the debug port. Such a concept may be advantageous because the possibly non-deterministic behavior of the operating system, which may not be well-documented, is avoided. Rather, a bare metal program is provided, which may be understood in more detail by the software engineer, and which may therefore provide better-reproducible test results in some cases.

Also, the usage of a bare metal program may have the advantage that the program is more "slim" such that the usage of external DRAM may not be necessary.

Bare Metal Candidate U-BOOT Boot Loader

It has been found that the so-called "U-Boot" boot loader may be a good candidate on a system-on-chip.

It has been found that this bare metal candidate is a most commonly used boot loader on SoC.

Moreover, it has been found that the bare metal candidate utilizes a device tree to describe common variations of embedded CPUs. This makes it easy to adjust to new CPU variants.

Moreover, the above-mentioned bare metal candidate handles the basic hardware initialization.

Further, it has been found that the above-mentioned bare metal candidate does not use memory virtualization and has a minimal memory footprint.

Furthermore, it has been found that the above-mentioned bare metal candidate, out of the box, only runs on a single CPU—even on a multi-core system. However, the above-mentioned bare metal candidate supports a basic set of local and network interfaces for OS load.

The above-mentioned bare metal candidate provides a command line interface accessible via the serial interface.

The above-mentioned bare metal candidate has been found to boot in the millisecond range.

Moreover, the above-mentioned bare metal candidate is open source and extensible. Accordingly, it may be possible to use the boot loader as a base for an embedded test runtime environment by adding missing features (e.g., multi CPU support).

Embedded Test Framework: OS Vs. Bare Metal

In the following, some advantages of using an operating system and some advantages of using bare metal (e.g., without an operating system) will be described.

Os Advantages:
1. Existing device driver can be used "as is". For most common peripheral interfaces, device drivers are already available.
2. Out of the box support for multi-tasking on multiple CPUs
3. Memory virtualization hides physical memory layout. This simplifies programming and debug.

Bare Metal Advantages:
1. Boot time reduce from seconds to microseconds
2. Significantly reduced memory footprint
3. Full hardware control due to low level access. This improves test coverage and repeatability
4. Easier to adjust to incomplete hardware resources like missing DRAM.

As a conclusion, it can be said that a bare metal approach is best suited for embedded test at a wafer sort. Moreover, it can be said, as a conclusion, that the OS approach offers a simplified use model. It has been found that extended boot time and larger memory footprint might be acceptable—especially for post silicon validation.

7. Physical OCST Controller

In the following, an embodiment of a physical on-chip-system test controller will be described. However, it should be noted that the physical on-chip-system test controller described herein may optionally be supplemented by any of the features, functionalities and details described with respect to an on-chip-system test controller herein, both individually and taken in combination. Moreover, it should be noted that any of the features, functionalities and details described with respect to the on-chip-system test controller of FIG. 16 can optionally be taken over into any of the other on-chip-system test controllers, both individually and taken in combination.

Figure 16:
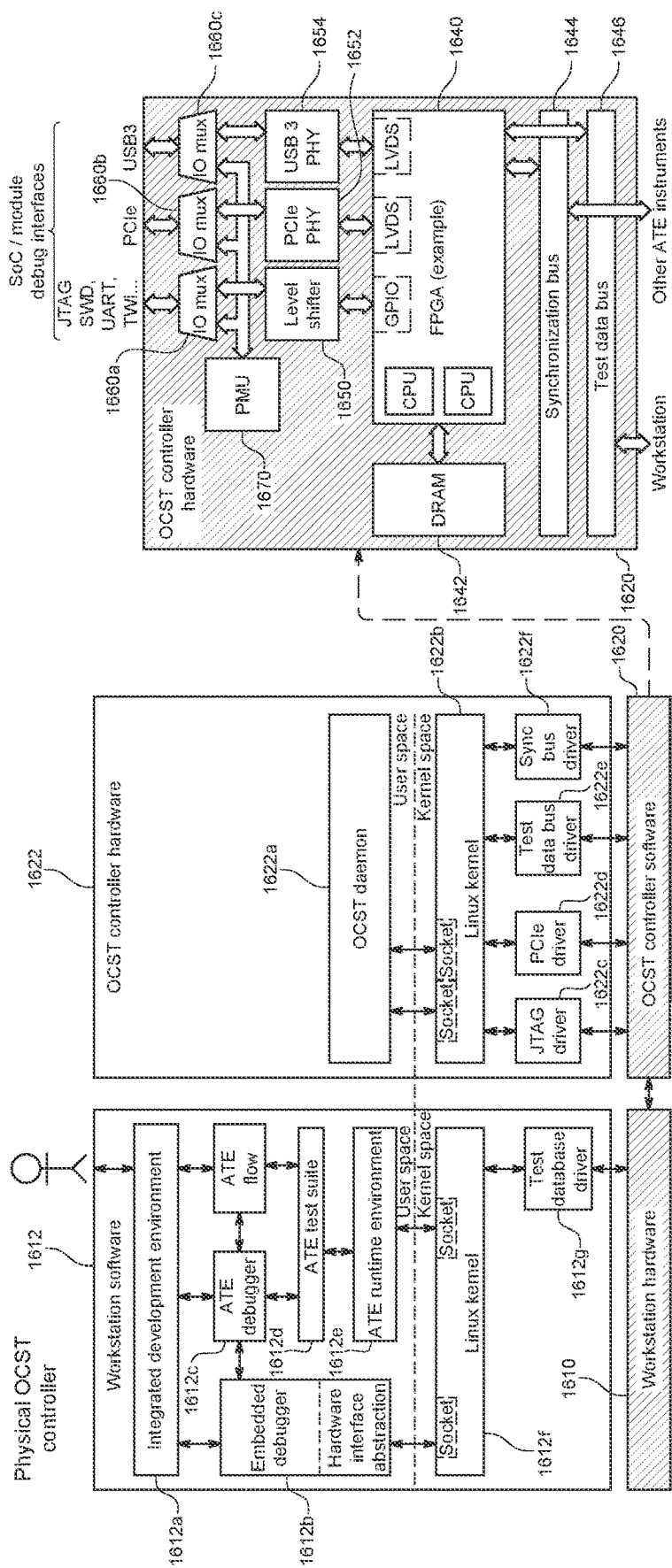
FIG. 16 shows a block schematic diagram of a physical OCST controller.

FIG. 16 shows a schematic representation of a physical on-chip-system test controller, which may be part of an automated test equipment. Moreover, FIG. 16 also shows a schematic representation of a work station that cooperates with the physical on-chip-system test controller. In other words, the automated test equipment comprises a work station hardware 1610 and an on-chip-system test controller hardware 1620.

The work station hardware 1610 is adapted to execute a work station software 1612, and the on-chip-system test controller hardware 1620 is configured to execute an on-chip-system test controller software 1622. The work station software 1612 may, for example, comprise an integrated development environment 1612*a* which may, for example, correspond to the development and the debug environment 240 described above. However, any features, functionalities and details of this work station software 1612 may optionally also be included into the development and debug environment 240.

In particular, the work station software comprises an embedded debugger 1612*b* which may, for example, correspond to the embedded software debugger 1214*a*. Moreover, the work station software may also comprise an ATE debugger 1612*c* which may, for example, correspond to the ATE debugger 1214*b*. The work station software 1612 may further comprise an ATE test suite 1612*d* which may, for example, correspond to the ATE test suite 1218. The work station software 1612 may further comprise an ATE runtime environment 1612*e* which may, for example, correspond to the ATE runtime environment 1219.

Moreover, the work station software may, for example, comprise, in a kernel space, a Linux kernel 1612*f*, which may, for example, be accessed by the ATE runtime environment 1612*e* via a socket. Similarly, the embedded debugger 1612*b*, which may also comprise a hardware interface abstraction, may communicate with the Linux kernel 1612*f* via a socket of the Linux Kernel.

Moreover, the Linux kernel may use a so-called "test data bus driver" 1612*g*, which may allow for a communication with the OCST controller hardware. However, any other driver that allows for a communication with the OCST controller hardware could also be used.

Moreover, the OCST controller software 1622 comprises a so-called OCST daemon 1622*a*, which is, for example, executed in a user space. Moreover, the OCST controller software 1622 also comprises a Linux kernel 1622*b*, which may, for example, be run in a kernel space. For example, a communication between the OCST daemon 1622*a* and the Linux kernel 1622*b* may be performed using one or more sockets of the Linux kernel.

Moreover, the OCST controller software 1622 may comprise a plurality of drivers, like, for example, a JTAG driver 1622*c*, a PCIe driver 1622*d*, a "test data bus driver" 1622*e*, and a synchronization bus driver 1622*f*. For example, the test data bus driver 1622*e* may support a communication with the work station. However, any other driver which allows for communication with the work station would also be appropriate. The synchronization bus driver 1622*f* allows for an access to a synchronization bus, which allows for a synchronization with other test resources (like, for example, the test resources 220, 230 described above). Moreover, the JTAG driver (or, generally, any debug interface driver) allows for communicating with the device under test via a debug interface. Similarly, the PCIe driver (or any other high bandwidth interface driver) allows for a communication with the device under test via a high bandwidth interface.

In the following, hardware features of the physical OCST controller will also be described. For example, the physical OCST controller may comprise a field programmable gate array 1640, which may, for example, be configured to implement one or more central processing units CPU. Moreover, the field programmable gate array 1640 may be configured to communicate with any internal or external random access memory, for example, a DRAM 1642. The field programmable gate array 1640 may, for example, be coupled with a synchronization bus 1644, which may, for example, also coupled with other ATE instruments. For example, the synchronization bus may allow for a synchronization between the physical on-chip-system test controller and other test resources, like parametric test resources and/or digital test resources (for example, as described above). Moreover, the field programmable gate array 1640 is also coupled to a data bus (or, generally speaking, to a data interface) 1646, which allows for a communication with the work station 1610. In the example provided, a so-called "test data bus" is used, but other interfaces to the work station could also be used.

The on-chip-system test controller further comprises a plurality of level shifters 1650, and optionally also comprises a PCIe physical interface 1652 and a USB physical interface 1654 (e.g., a USB3 physical interface). For example, the level shifters 1650 are coupled to general purpose input/output pins of the field programmable gate array 1640. On the other hand, the optional PCIe physical interface and the optional USB physical interface may be coupled to high speed pins (e.g., LVDS pins) of the field programmable gate array 1640.

Device-sided pins of the level shifter 1650, of the PCIe physical interface 1652 and of the USB physical interface 1654 may, for example, be coupled to a DUT interface via a plurality of input/output multiplexers 1660*a*, 1660*b* (optional), 1660*c* (optional).

Using the input/output multiplexers 1660*a*, 1660*b*, 1660*c*, the level shifter 1650, the PCIe physical interface and the USB physical interface 1654 can be coupled to appropriate pins of the device under test. For example, the signals provided by the level shifter 1650 may preferably be coupled to a debug interface or control interface of the device under test, for example, to a JTAG interface, a SWD interface, a UART interface, a TWI interface, or the like. However, the signals provided by the PCIe physical interface are typically connected to a PCIe interface of the device under test via the respective input/output multiplexer 1660*b*, and the signals provided by the USB physical interface 1654 are typically coupled to a USB interface (e.g., a USB3 interface) of the device under test via the respective input/output multiplexer 1660*c*. Moreover, the input/output multiplexers 1660*a*, 1660*b*, 1660*c* may be configured to couple a parametric measurement unit 1670 with one or more pins of the device under test in an adjustable (variable) manner. Accordingly, analog characteristics of the respective pins of the device under test can be characterized by the physical measurement unit 1670.

To conclude, an example implementation of a physical OCST controller has been described taking reference to FIG. 16. For example, the on-chip-system test controller hardware described in FIG. 16 may optionally be used to implement any of the on-chip-system test controllers described herein. However, optionally, one or more components of the on-chip-system test controller according to FIG. 16 can be used in any of the on-chip-system test controllers disclosed herein.

Moreover, it should be noted that the automated test equipment described here may optionally be supplemented by any of the features, functionalities and the details disclosed herein, both individually and taken in combination.

8. Discussion in View of Alternative Solutions

In the following, some alternative solutions will be discussed, and advantages with using an on chip system test controller will be pointed out.

The first alternative solution is to perform a system level test. In this approach, an existing evaluation board is taken or a special version is derived from it. Bench equipment is used to provide the external environment. Specialized system level test equipment is used for test automation. Existing verification tests for the application are run, and a check for correct execution is performed.

This approach has a number of benefits. For example, a native environment for designers and validation engineers is used. Existing applications/validation software is leveraged. The approach is well-established for module test, and original solutions are available. The approach also works with cheap equipment.

However, the approach also has a number of disadvantages, which will be outlined in the following. For example, there is a poor repeatability and observability due to the use of the application board. Moreover, there are long test times and questionable coverage when using the application software. Maximum stress conditions cannot be applied, or can only be applied when clocks and supply voltage can be controlled on the application board. This is usually not the case. Moreover, the approach cannot be deployed in wafer sort. Typically, there are technical difficulties to integrate the application board with the wafer prober. Moreover, there are also commercial issues with long test times on an expensive probe equipment. Moreover, the approach typically requires an additional test step late in the manufacturing process.

Moreover, a so-called "end-to-end test" can be considered as another approach. This approach takes an ATE with specialized "protocol aware" instruments. The DUT internal signal paths are tested with end-to-end communication.

Such an approach has a number of benefits. For example, the approach supports the classical ATE thinking of observing the device interface. Moreover, the approach covers internal interconnect fabric, protocol engines and analog interface circuits in one shot. The approach allows to apply clock and supply voltage stress. Furthermore, the approach eliminates a significant amount already during wafer sort. The approach enables post silicon validation during wafer sort and enables early feedback to design.

However, the end-to-end test approach also has a number of disadvantages. In particular, the approach is insufficient to stress the internal interconnect with maximum traffic, because the internal interconnect is usually faster than the interfaces. Moreover, high speed traffic cannot be covered with generic ATE instruments, as real-time protocol processing usually requires dedicated ASIC designs. Moreover, validation test cases most likely do not cover end-to-end communication, as they are not effective from a white box testing perspective. Test cases must be generated from scratch by test engineers.

In the following, a "statistical correlation" approach will be described. In this approach, during production ramp, almost all available scan vectors are run under different clock and voltage stress conditions in wafer sort. However, only DUTs failing under nominal conditions are binned out. Moreover, SLT tests are run to identify wafer sort escapes. Moreover, the overall failing DUTs are correlated with failing scan vectors under stress conditions. These failing tests are added in the final manufacturing sort program to eliminate SLT.

This approach has the advantage that the triage process can be fully automated and does not require any human interaction.

However, the approach has some disadvantages, which will be described in the following. AC scan methodologies are designed to cover stuck-at and delay faults. It is unclear whether the test escapes really map to these categories—even under voltage and clock stress conditions. Moreover, the approach does not ensure that third party peripheral IP works within specifications. Also, users might not trust the scan vectors supplied with this IP. Moreover, the approach requires additional scan vectors and switching of test conditions in the final test program. This leads to increased test time in wafer sort.

In the following, the on-chip-system test (OCST) approach will be described. The approach uses the DUT's embedded CPU to run parts of the test program. Also, a runtime environment is provided for these fragments as part of the ATE product.

The approach comprises a number of advantages. For example, the approach covers internal interconnect fabric, protocol engines and analogue interface circuits in one shot. Also, the approach allows to apply clock and supply voltage stress. The approach furthermore addresses all classes of potential test escapes already during wafer sort. Moreover, the approach can run slightly modified core logic test from validation. The approach works with standardized, flexible ATE instruments. In addition, the approach enables post silicone validation during wafer sort, and also enables early feedback to design.

However, the approach also comprises some disadvantages. In particular, the approach is a new approach outside of the MPU business. The approach exposes test engineers to embedded software development, designer and validation engineers to ATE. Moreover, unless standardized canned test cases can be provided, test cases must be generated manually. Test coverage depends on the quality of the these cases. Moreover, the approach relies on DFT (design for test) to eliminate the need for specialized HSIO instruments.

In the following, a comparison between different approaches will be provided.

It should be noted that SLT and end-to-end test are two approaches many users are comfortable with, especially validation engineers.

Moreover, it should be noted that SLT requires an additional test insertion—combining it with any ATE test step is not commercially viable.

Moreover, it should be noted that end-to-end test can be integrated in other ATE test setups. However, it requires "protocol-aware" ATE instruments. Also, it is very difficult to bring the DUT into a state of maximum stress.

Moreover, statistical correlation to scan pattern under a timing level stress condition is an interesting approach to cover gaps in traditional scan pattern. However, scan testing is based on a distinct fault model. It is unclear, whether today's ATE escapes can be covered this way at all.

With embedded test, it is possible to identify today's test escapes on ATE already during wafer sort. The need for a new specialized ATE instruments can only be eliminated with appropriate DFT. To apply it successfully, DUT knowledge is required, which is not available in test engineering, but validation and design.

It is believed that, in the long run, embedded tests should be the way to go.

9. Conclusions—Part 1

In the following, some conclusions will be provided.

It has been found that an increasing complexity of SoC designs drives a convergence between post silicone validation and ATE test:
1. ATE capabilities are required to find corner cases in the hardware/software interaction in validation; and
2. Tests running on the embedded CPU are required to identify corner case defects.

Running embedded software tests on ATE therefore offers great benefits for both validation and device manufacturing. However, as the application environment on ATE is incomplete, there is a high barrier to entry.

This opens up an opportunity for a new type of ATE product: an on-chip-system test environment.

It has been found that technological components for such environments are available, most parts of the existing ATE eco system can be leveraged.

It has also been found that a convergence of SoC components allows to focus on a standardized product. Dominance of ARM in the market even allows to focus on one particular architecture in the beginning.

To conclude, embodiments according to the invention may be used to test systems-on-a-chip in an efficient manner, and are therefore advantageous over other concepts.

10. Conclusions—Part 2

Prior Solutions

In the following, some conventional solutions will be described and discussed and background information will be provided, which may optionally also applied in embodiments according to the invention.

On-Chip System Test (OCST) refers to a functional test of one or more blocks or interfaces of an SOC with the help of embedded software running on embedded processor cores of that SOC. The embedded software may directly create the test stimulus and receive the test response and/or control the test setup (e.g. register programming) or test analysis and reporting: e.g. analyse test responses and store/communicate the results such that the outside (e.g. a tester) can access the test results.

Prior solutions rely on developing and debugging the test in a system environment for embedded software development, but not on the test environment. On the test environment debug support is not existing or weak: e.g. printing intermediate values and text strings through a serial port Prior solutions rely on the OCST to use proprietary ways to receive test control/condition commands and communicate test results to the outside. This does also require proprietary solutions for the test environment to send/receive these commands/results. Often this requires tedious low-level programming of tester resources (e.g. for UART, SWD, I2C or a proprietary GPIO comm's) respectively dedicated tester controller interfaces (e.g. if using its USB port) to enable communication and control between the tester environment with the OCST. This increases the development effort and limits the re-usability of OCST.

Prior solutions rely on storing the OCST (i.e. test content) on a non-volatile memory that is available for the SOC in the test environment to load the OCST. Challenges are The NV Memory is typically programmed in the software development environment and then carried over to the test environment.

The NV Memory may be programmed in the test environment with the help of the SOC, but this is a proprietary solution not applicable to other types of SOC Re-programming the NV Memory is an exceptional, ineffective, error-prone process on the manufacturing floor.

Prior solutions often store a suite of OCSTs that execute in one execution run rather than providing control of individual OCSTs, which makes it difficult to debug, characterize and turn on/off each test (which is a typical need of a test system).

Prior solutions may rely on a large RAM available for executing OCSTs, which may not be available (e.g. for probe test). A typical case is booting a rich OS, which is then the foundation for other OCSTs Embodiments according to the invention fully solve, or at least alleviate all (or some) of the disadvantages mentioned before in the description of the conventional solutions.

Problems Solved by Embodiments of the Invention

In the following, some advantages of embodiments of the invention over conventional solutions will be discussed. However, it should be noted that it is not necessary that embodiments according to the invention comprise some or all of the advantages mentioned in the following.

Some embodiments according to the invention fully solves or alleviates all of the disadvantages listed in the description of Prior Solutions Furthermore, embodiments according to the described invention optionally enable future solutions:
 By defining standard interfaces, the invention enables an automated flow of SOC verification tests (that are implemented as embedded software) to a test environment for effective execution and qualification of each test
 Advanced test and diagnostic methodologies relying on high-bandwidth tracing and dumping of DUT states: e.g. statistical approaches as described in "Bug Positioning Systems" to determine a valid execution behavior and identifying failing areas for root cause analysis.
 By providing an effective functional interface between the test environment and the SOC, other test methodologies may benefit: e.g. flexibly feeding structural test stimulus into the DUT respectively receiving it.

Advantages of the Invention Over What has been Done Before

Embodiments according to the invention establish an effective test environment for on-chip system tests, by separating the DUT-specific nature of the OCST itself from the infrastructure and capabilities needed for test. Accordingly, it proposes flexible solutions for OCST as a new test type for which a test environment needs to support all standard test use cases: e.g.
 Development
 Debug
 Characterization
 Efficient execution
 Data logging
 Deployment on the manufacturing floor
This enables an effective collaboration between the OCST developer (typically, a design, bench or emb. software developer) and the test engineer. Each user can intuitively continue working in his/her environment: e.g.
 The OCST developer finds a productive development and debug environment on the tester. This is particularly critical during the high-pressure first-silicon turn-on.
 The Test Engineering can characterize each OCST in the same way done for other test types: e.g. sweep Vdd to determine Vmin.
 When deploying an OCST onto the manufacturing floor, no additional step is needed by the operator to install the latest version of an OCST on a NV Memory located on the loadboard.
Moreover, it is possible to list an advantage for each problem mentioned above.

Description of the Construction and Operation of Embodiments According to the Invention In the following, a description of the construction operation of some embodiments according to the invention will be provided. However, it should be noted that the embodiments described in the following may be used individually. However, it should also be noted that features, functionalities and the details of the embodiments mentioned in the following can be introduced into any of the other embodiments, both individually and taken in combination.

On the highest level, the solution proposes the following key components that are combined for an effective OCST environment (wherein the components can also be used individually):

1. OCST Test Controller:
 a. A novel test component offering the following capabilities (or, in some embodiments, one or more of the following capabilities):
  i. Communication with the DUT through its physical interfaces: e.g.
   1. Low-latency debug and control interfaces: e.g. JTAG, SWD, SPI, I2C, UART
   2. High-bandwidth functional interfaces: e.g. USB, PCI
  ii. Flexible allocation of the correct communication interface to the DUT Interface or allocating Parametric Test resources typically used for testing the contact and DC of the physical DUT interface
  iii. Running a versatile software stack typically including an OS (e.g. embedded Linux), general purpose services for OCST, drivers for communicating through the physical interfaces to the DUT, application-specific setups and routines (i.e. executable code) provided by the user.
  iv. Ability to load respectively initialize the OCST environment on the DUT and DUT interface. It is, for example, prepared and maintained as part of the test program and stored in the OCST Test Controller memory for rapid initialization of each DUT
  v. Ability to load an OCST into the DUT RAM, DUT NV Memory or NV Memory on the DUT Interface. For example, each OCST is prepared and maintained as part of the test program and stored in the OCST Test Controller memory for rapid loading into each DUT.
  vi. Ability to load an OCST parameter set into the DUT RAM, DUT NV Memory or NV Memory on the DUT Interface. For example, each OCST parameter set is prepared and maintained as part of the test program and stored in the OCST Test Controller memory for rapid loading into each DUT.
  vii. Ability to start a specific OCST loaded on the DUT
  viii. Overall test execution control as programmed by the user in a universal test sequencing language that applies to all tester resources: e.g. the Operating Sequence used by 93000 SmarTest 8.
  ix. Efficient control and synchronization of other test resources: e.g. the OCST test controller can directly control the power applied to the DUT. Preferably the execution of these actions does not require communication with the higher-level software typically running on a tester controller. Instead it is, for example, implemented by local communication and synchronization interfaces directly connecting the tester resources.
  x. Ability to receive commands and data from the OCST running on the DUT to control the test execution flow and its involved test resources: e.g. implementing conditional execution or varying of external test conditions depending on observations done by the OCST running on the DUT.
 b. Both a physical and virtual implementation is possible and with various advantages and disadvantages: e.g.

i. Physical: preferably implemented in a versatile dedicated tester sub-system including, for example,
   1. A system SOC (e.g. Xilinx Zync) providing an embedded software environment, an FPGA block as well as various physical instances for communication (e.g. USB, GPIO); alternatively, as another example, an x86 embedded PC could be used.
   2. Front-end electronics towards the DUT: e.g. a PMU for DC measurements, switches for routing, level shifters to adapt to the specific interface standard.
   3. Back-end interfaces to communicate and synchronize with the other tester components
ii. Virtual: preferably implemented by re-using a general purpose test module (e.g. a digital tester card). Typically, front-end and back-end capabilities of this card can be used for OCST. However, the following capabilities may need to be added:
   1. An effective high-level programming model to communicate with the DUT/OCST through its physical interfaces. This may be limited in speed and functionality by the extended test module.
   2. The ability to break-up the OCST software stack to either run on the module directly (assuming an available emb. Processor) or on the tester controller 2. OCST Development and Debug Tools (Optional; One or More of the Features May be Implemented)
   a. Toolsets:
      i. Typically, the embedded software developer that is responsible for developing an OCST has a preferred or pre-determined development and debug environment. The proposed solution provides, for example, interfaces to support varying tool sets.
      ii. The solution offers a specific OCST development and debug environment integrated into the Tester Environment (e.g. Eclipse Work Center of 93000).
         1. This eases consistent naming and use of components in the OCST source code and the Test Program running on the tester: e.g. OCST development and debug tools may be aware of test resources that the OCST source code is able to access (through the OCST runtime environment): e.g. test limits, test conditions or results of other tests.
         2. Supports mapping the compiled code to the available, limited memory resources: e.g. integrated SRAM, L2-Cache. As needed include code to condition the memory subsystem of the SOC.
   b. Interfaces between the debug software, the Tester Environment and the DUT
      i. Interfaces between the debug software and the tester environment:
         1. Remote Control: During debug and test execution the test environment may use the debug software (typically, from a 3$^{rd}$ party or open source) to perform specific operations it was developed for: e.g. load an OCST onto the DUT. The test environment relies on a "Remote Control API" to use the debug environment for these purposes.
         2. DUT driver: During debug and test execution the debug software may need to access the DUT through its physical interfaces: e.g. JTAG. Rather than having its own physical interface to the DUT, the debug software may rely on the OCST Test Controller's physical interface to the DUT. Accordingly, the test environment implements a DUT driver supporting the functions of the debug software.
      ii. Physical interfaces between the debug software and the DUT
         1. Direct physical access by the debug environment: e.g. to JTAG port that may be switched on the loadboard
         2. Use of OCST Test Controller as communication channel.

3. Software Components and Environment Enabling Effective Use of OCST
   a. Distributed environment to support the seamless development and execution of a test methodology comprise of test setup and code running in the tester environment (i.e. tester controller workstation and OCST test controller) as well in the DUT environment (i.e. the OCST itself as well as other components on the DUT interface: e.g. NV Memory). It is implemented independent from the varying communication interfaces between the OCST Test Controller and the DUT.
      i. OCST Runtime Environment (on the DUT):
         1. APIs and services that an OCST can rely on to communicate with the tester environment in general (e.g. to receive test parameters and send control commands to the OCST Test Controller) and with the specific test method running on the tester environment (e.g. to exchange intermediate variables leveraging the higher computational capabilities of a tester workstation)
         2. The OCST Runtime Environment is standardized to enable re-use of OCST across various DUTs. This is enabled by underlying layers of software abstracting the varying hardware environment: e.g. using a Linux Device Tree describing the hardware differences.
      ii. OCST Test Runner (on the DUT):
         1. Program (preferably running as a separate process) that partners with the tester environment to load and execute OCSTs. Also, it may serve as a watch-dog assuring the continued execution and responsiveness to the tester environment despite a partly broken DUT or failing OCST.
         2. This is optional, since its critical function can also be done from the tester environment using the DUT's debug interfaces
      iii. Tester Runtime Environment extended for OCST:
         1. APIs and services the user's test method can rely on to setup and communicate with the OCST Test Controller
         2. APIs and services the user's test method can rely on to setup and communicate with the OCST running on the DUT
      iv. Synchronization of tester resources, OCST test controller and OCST:
         1. Actions that the OCST Test Controller can perform during test execution in support of OCST: e.g. conditional jumps depending on control information coming from the OCST
         2. Extensions to the tester module's capabilities or set of actions in order to support OCST: e.g. wait for an OCST to complete
         3. Required hardware infrastructure to efficiently signal and communicate across tester resources and OCST test controller without requiring tester controller workstation software.

b. Alternative software environment
   i. Using an OCST Operating System: Provided a rich execution environment (e.g. sufficient RAM), the DUT might load an OS and the required device drivers. This may add test coverage and provide advanced services for an OCST, the OCST runtime environment and the OCST runner: e.g. access to a file system.
      1. The OCST OS is a specific version of an OS relying on a limited system environment of the DUT: e.g. without a physical display. Accordingly, the set of standard device drivers is limited and can be configured
      2. The OCST OS is standardized to enable re-use of OCST across various DUTs. This is enabled by underlying layers of software abstracting the varying hardware environment: e.g. using a Linux Device Tree describing the hardware differences.
      3. The OCST OS supports DUT or application-specific device drivers
   ii. Bare Metal: The DUT's execution environment might be constraint and not require advanced OS service. Hence the OCST Operation System might not be used and the functions of the OCST Runtime Environment are implemented directly on the hardware (comparable to the environment of a boot loader).

For details, which should all be considered as being optional, reference is made to the full description.

Embodiments according to the present invention can, for example, be used in a testing of SOCs, SIPs or Modules with at least one embedded processor. The following disclosure lists only "SOC" or "OUT", but it is applicable to higher levels of integration in a package or on any kind of module implementing a (sub-) system.

Embodiments according to the invention, can, for example, be used in a 93000 chip tester, but generally can be used as an extension to any test solution.

11. Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An automated test equipment for testing a device under test the automated test equipment comprising:
an on-chip-system-test controller comprising at least one debug interface configured to communicate with the device under test, wherein the on-chip-system-test controller is configured to control a test of the device-under-test, wherein the device-under-test comprises a system-on-a-chip; and a development and debug environment adapted to develop and debug both on-chip-system test software for execution on the device-under-test and a test program to be executed by the automated test equipment, wherein the development and debug environment allows the device-under-test to access and change one or more characteristics associated with test resources of the automated test equipment when developing and debugging on-chip-system test software for execution on the device-under-test.

2. The automated test equipment according to claim 1, wherein the on-chip-system-test controller further comprises at least one high bandwidth interface configured to communicate with the device under test.

3. The automated test equipment according to claim 1, wherein the on-chip-system-test controller is configured to variably allocate the at least one debug interface to a device-under-test interface.

4. The automated test equipment according to claim 1, wherein the on-chip-system-test controller is configured to variably allocate one or more parametric test resources to the device under test.

5. The automated test equipment according to claim 1, wherein the on-chip-system-test controller is configured to execute a software stack comprising an operating system, an on-chip-system-test service software, and one or more drivers for communicating with the device under test through the at least one debug interface.

6. The automated test equipment according to claim 1, wherein the on-chip-system-test controller is configured to execute application-specific routines provided by a user.

7. The automated test equipment according to claim 1, wherein the on-chip-system-test controller is configured to selectively perform one of: load an on-chip-system-test environment onto the device-under-test; and load an on-chip-system-test onto the device-under-test; and initialize an on-chip-system-test environment on the device-under-test.

8. The automated test equipment according to claim 1, wherein the on-chip-system-test controller is configured to upload a parameter set onto a device-under-test, wherein the parameter set is operable to parametrize an on-chip-system test.

9. The automated test equipment according to claim 1, wherein the on-chip-system-test controller is configured to start an on-chip-system test loaded onto a device under test.

10. The automated test equipment according to claim 1, wherein the on-chip-system-test controller is configured to control the test of the device-under-test on a basis of an overall test execution program in a test sequencing language.

11. The automated test equipment according to claim 1, wherein the on-chip-system-test controller is configured to control one or more analog test resources; and wherein the on-chip-system-test controller is configured to control, in addition to the at least one debug interface, one or more digital test resources; and wherein the on-chip-system-test controller is configured to synchronize one or more analog test resources; and wherein the on-chip-system-test controller is configured to synchronize, in addition to the at least one debug interface, one or more digital test resources.

12. The automated test equipment according to claim 1, wherein the on-chip-system-test controller comprises a local communication interface operable to control one or more analog test resources and/or one or more digital test resources; and wherein the on-chip-system-test controller comprises a local synchronization interface operable to synchronize one or more analog test resources and one or more digital test resources.

13. The automated test equipment according to claim 1, wherein the on-chip-system-test controller is configured to receive commands and data from an on-chip-system test executing on the device under test, and to adapt a test execution flow in dependence on the received commands and the received data.

14. The automated test equipment according to claim 1, wherein the on-chip-system-test controller is configured to receive commands and data from an on-chip-system test executing on the device under test, and to adapt test resources in dependence on the received commands and the received data.

15. The automated test equipment according to claim 1, wherein the on-chip-system-test controller further comprises a central unit configured to provide an embedded software environment and one or more interface blocks implementing the at least one debug interface; and wherein the on-chip-system-test controller further comprises front-end electronics operable for providing one or more signals to the device under test and for receiving one or more signals from the device under test; and wherein the on-chip-system-test controller further comprises one or more backend interfaces configured to communicate with one or more other components of the automated test equipment and to synchronize with one or more other components of the automated test equipment.

16. The automated test equipment according to claim 1, further comprising an interface to one or more development and debug environments.

17. The automated test equipment according to claim 1, further comprising an interface and
wherein the development and debug environment comprises a program code to allow access to a memory content from the system-on-a-chip via the interface.

18. The automated test equipment according to claim 1, wherein the development and debug environment comprises an interface to allow a debug software to control an upload of a program and one or more parameter sets onto the device under test.

19. The automated test equipment according to claim 1, wherein the development and debug environment comprises an interface to allow a debug software to access a debug interface of the device under test.

20. The automated test equipment according to claim 1, wherein the development and debug environment is configured to provide a debug software direct access to a debug interface of the device under test.

21. The automated test equipment according to claim 1, wherein the development and debug environment comprises an application programming interface for use in a development of on-chip-system software to allow for a communication between the device-under test and test resources of the automated test equipment when the developed on-chip-system test software is executed on the device-under-test.

22. The automated test equipment according to claim 21, wherein the development and debug interface also comprises tester software to support communication of test resources of the automated test equipment with a device under test executing the developed on-chip-system test software.

23. The automated test equipment according to claim 1, wherein the development and debug environment comprises a program for use in a development of on-chip-system test software, to allow for an upload of further software from the automated test equipment to the device-under-test and to allow for controlling of a program execution on the device under test by the automated test equipment.

24. The automated test equipment according to claim 1, wherein the development and debug environment comprises a program for use in a development of on-chip-system test software to supervise a program executing on the device under test.

25. The automated test equipment according to claim 1, wherein a controller of the automated test equipment is configured to synchronize one or more tester resources, the on-chip-system-test controller and an on-chip-system test executed on the device under test.

26. The automated test equipment according to claim 1,
wherein the on-chip-system-test controller is configured to perform conditional jumps in a test program performed by the automated test equipment responsive to control information provided by an on-chip-system-test running on the device under test.

27. The automated test equipment according to claim 1, wherein the on-chip-system-test controller is configured to wait for a completion of an on-chip-system-test running on the device under test.

28. An automated test equipment for testing a device under test comprising:
an on-chip-system-test controller comprising at least one control interface configured to communicate with the device under test, wherein the on-chip-system-test controller is configured to control a test of the device-under-test, wherein the device-under-test is a system-on-a-chip, wherein the on-chip-system-test controller is configured to variably allocate the at least one control interface to a device-under-test interface; and
a development and debug environment adapted to develop and debug both on-chip-system test software for execution on the device-under-test and a test program to be executed by the automated test equipment, wherein the development and debug environment allows the device-under-test to access and change one or more characteristics associated with test resources of the automated test equipment when developing and debugging on-chip-system test software for execution on the device-under-test.

29. An automated test equipment for testing a device under test comprising:
an on-chip-system-test controller comprising at least one high bandwidth interface configured to communicate with the device under test, wherein the on-chip-system-test controller is configured to control a test of the device-under-test, wherein the device-under-test is a system-on-a-chip, wherein the on-chip-system-test controller is configured to variably allocate the at least one high bandwidth interface to a device-under-test interface; and
a development and debug environment adapted to develop and debug both on-chip-system test software for execution on the device-under-test and a test program to be executed by the automated test equipment, wherein the development and debug environment allows the device-under-test to access and change one or more characteristics associated with test resources of the automated test equipment when developing and debugging on-chip-system test software for execution on the device-under-test.

\* \* \* \* \*